United States Patent
Grube et al.

(10) Patent No.: US 9,843,412 B2
(45) Date of Patent: *Dec. 12, 2017

(54) OPTIMIZING ROUTING OF DATA ACROSS A COMMUNICATIONS NETWORK

(71) Applicant: CLEVERSAFE, INC., Chicago, IL (US)

(72) Inventors: Gary W. Grube, Barrington Hills, IL (US); Timothy W. Markison, Mesa, AZ (US); S. Christopher Gladwin, Chicago, IL (US); Greg Dhuse, Chicago, IL (US); Andrew Baptist, Mt. Pleasant, WI (US); Ilya Volvovski, Chicago, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 177 days.

This patent is subject to a terminal disclaimer.

(21) Appl. No.: 14/615,655

(22) Filed: Feb. 6, 2015

(65) Prior Publication Data

US 2015/0155968 A1 Jun. 4, 2015

Related U.S. Application Data

(63) Continuation-in-part of application No. 13/251,603, filed on Oct. 3, 2011.
(Continued)

(51) Int. Cl.
*H03M 13/00* (2006.01)
*G06F 15/173* (2006.01)
(Continued)

(52) U.S. Cl.
CPC ........ *H04L 1/0045* (2013.01); *G06F 11/1028* (2013.01); *G06F 17/30194* (2013.01);
(Continued)

(58) Field of Classification Search
None
See application file for complete search history.

(56) References Cited

U.S. PATENT DOCUMENTS 4,092,732 A 5/1978 Ouchi
5,454,101 A 9/1995 Mackay et al.
(Continued)

OTHER PUBLICATIONS

A. Albanese, J. Blomer, J. Edmonds, M. Luby and M. Sudan, "Priority encoding transmission," Foundations of Computer Science, 1994 Proceedings., 35th Annual Symposium on, Santa Fe, NM, 1994, pp. 604-612. doi: 10.1109/SFCS.1994.365731.*
(Continued)

*Primary Examiner* — Justin R Knapp
(74) *Attorney, Agent, or Firm* — Garlick & Markison; Timothy W. Markison; Edward J. Marshall

(57) ABSTRACT

A method begins by a first computing device determining a routing plan to route a set of encoded data slices from the first computing device to a second computing device via a plurality of network paths of a communications network. The method continues with the second computing device receiving encoded data slices via one or more network paths. When the second computing device receives a decode threshold number of encoded data slices, the method continues with the second computing device sending a message to the communications network indicating receipt of the decode threshold number of encoded data slices. The method continues with a relay unit determining whether the relay unit is in possession of a not-yet delivered encoded data slice. When the relay unit is in possession of the not-yet
(Continued)

delivered encoded data slice, the method continues with the relay unit ceasing forwarding of the not-yet delivered encoded data slice.

16 Claims, 27 Drawing Sheets

Related U.S. Application Data

(60) Provisional application No. 61/390,472, filed on Oct. 6, 2010.

(51) Int. Cl.

| | | |
|---|---|---|
| *H04L 1/00* | (2006.01) | |
| *H04L 12/933* | (2013.01) | |
| *G06F 17/30* | (2006.01) | |
| *G06F 11/10* | (2006.01) | |
| *H03M 13/05* | (2006.01) | |
| *H03M 13/29* | (2006.01) | |
| *H03M 13/37* | (2006.01) | |
| *H04L 12/707* | (2013.01) | |
| *H04L 12/725* | (2013.01) | |
| *H04L 12/721* | (2013.01) | |

(52) U.S. Cl.
CPC .......... *H03M 13/05* (2013.01); *H03M 13/29* (2013.01); *H03M 13/373* (2013.01); *H03M 13/3761* (2013.01); *H04L 45/24* (2013.01); *H04L 45/30* (2013.01); *H04L 49/15* (2013.01); *G06F 11/1076* (2013.01); *G06F 2211/1028* (2013.01); *H04L 45/12* (2013.01)

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |

OTHER PUBLICATIONS

Shamir; How to Share a Secret; Communications of the ACM; vol. 22, No. 11; Nov. 1979; pp. 612-613.

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner computing system 10

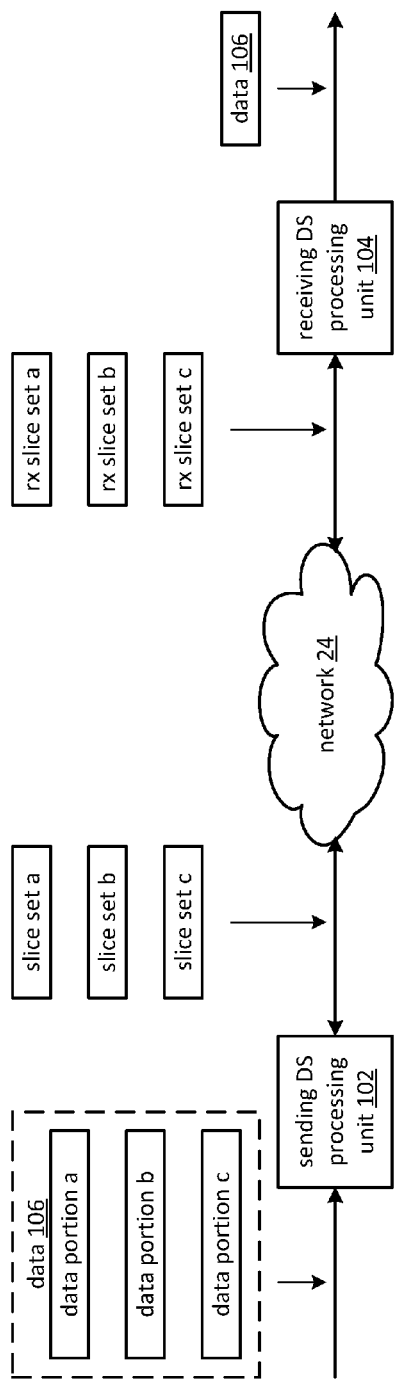
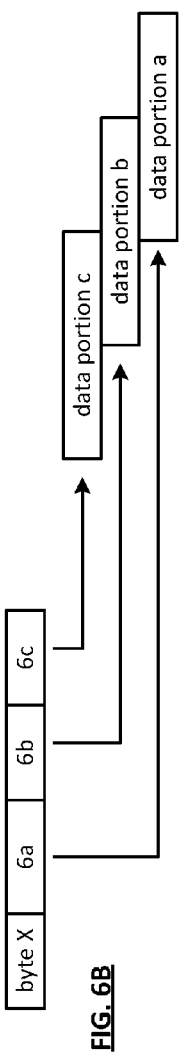
FIG. 6A
FIG. 6B

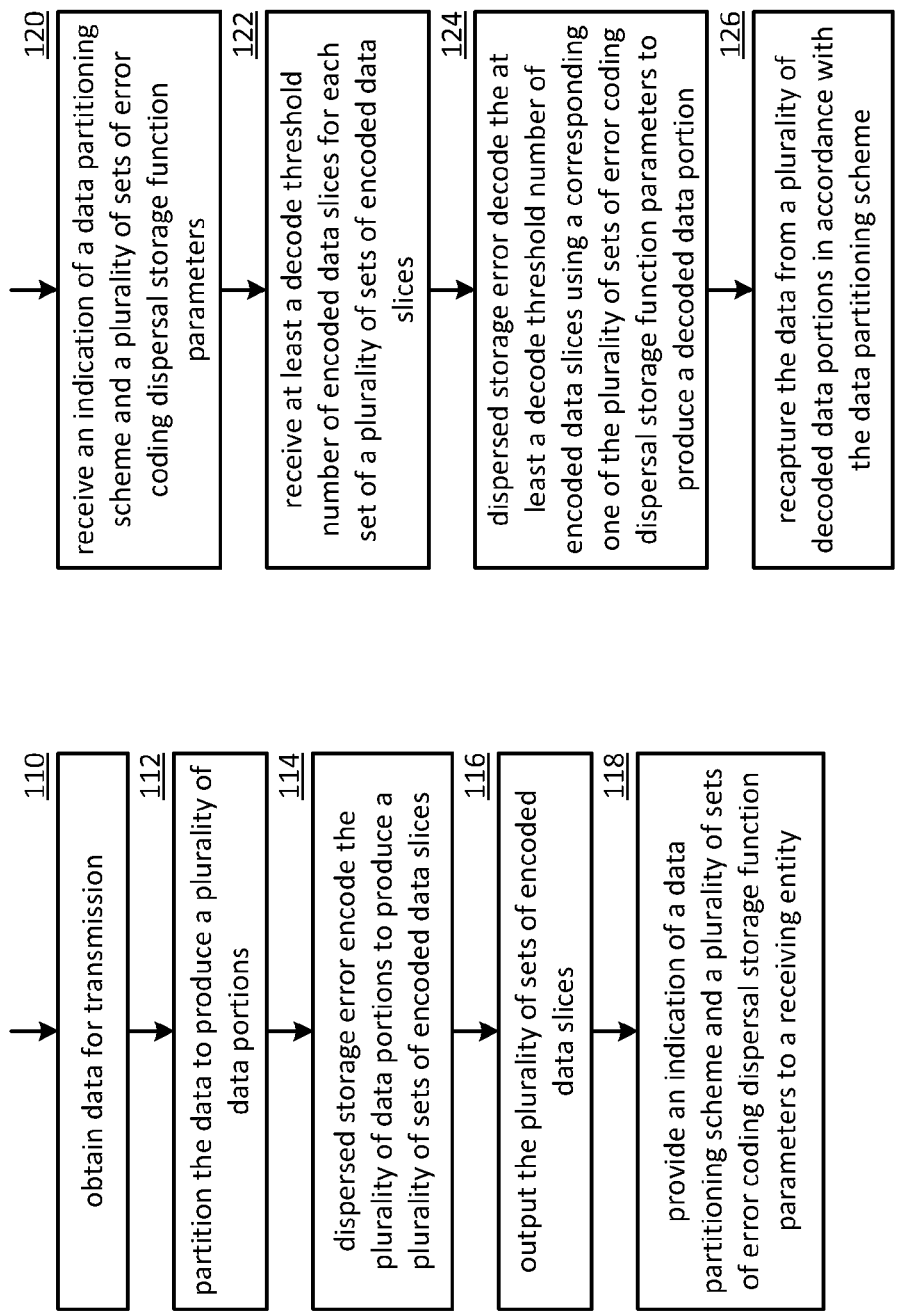

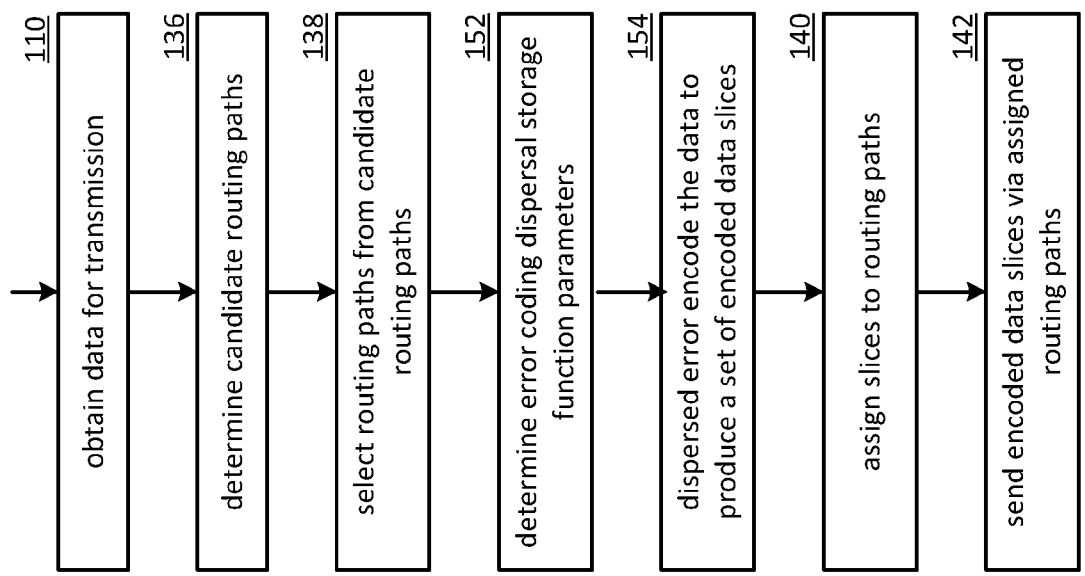

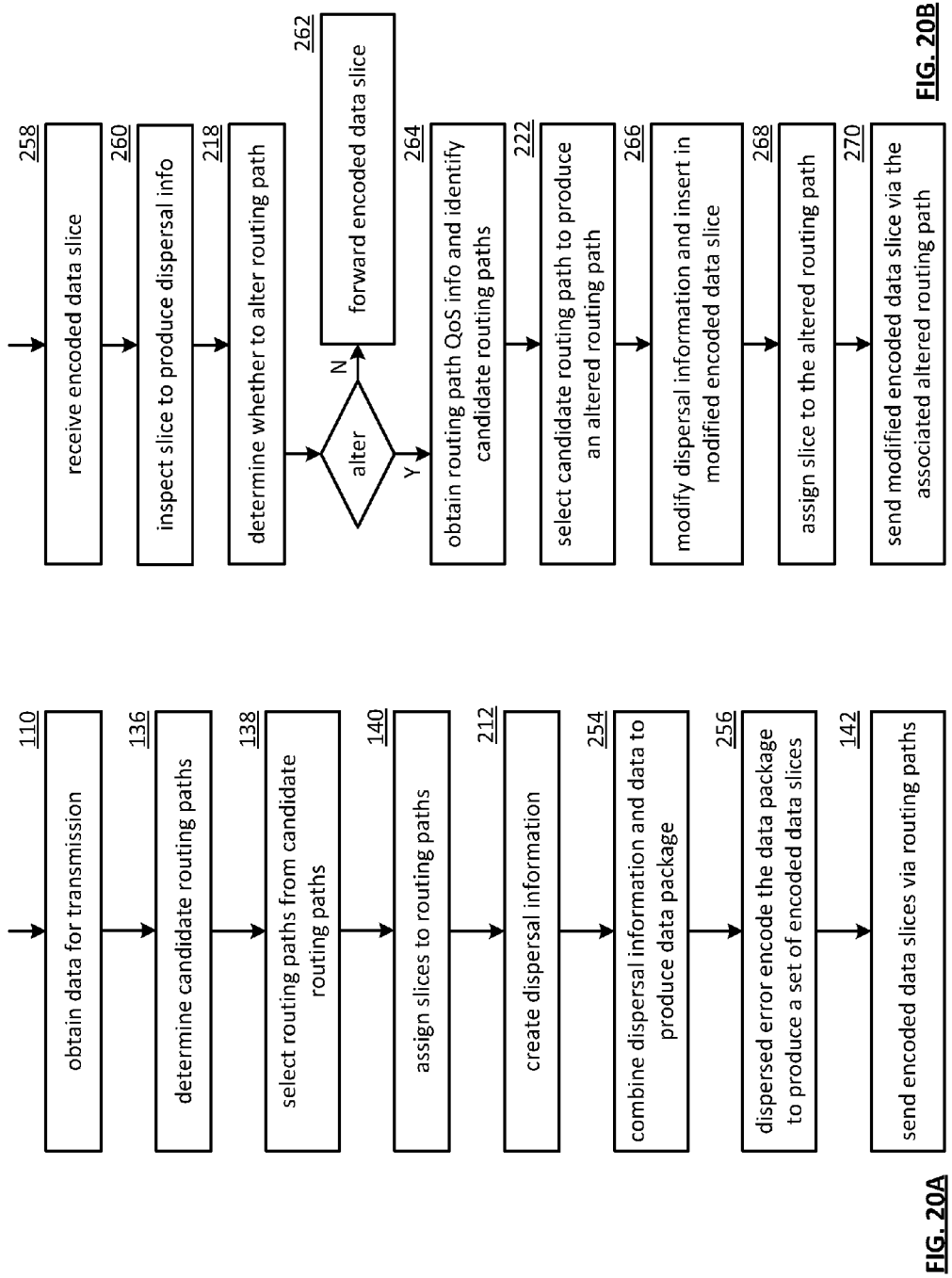

OPTIMIZING ROUTING OF DATA ACROSS A COMMUNICATIONS NETWORK

CROSS REFERENCE TO RELATED PATENTS

The present U.S. Utility patent application claims priority pursuant to 35 U.S.C. §120 as a continuation-in-part of U.S. Utility application Ser. No. 13/251,603, entitled "RELAYING DATA TRANSMITTED AS ENCODED DATA SLICES", filed Oct. 3, 2011, which claims priority pursuant to 35 U.S.C. §119(e) to U.S. Provisional Application No. 61/390,472, entitled "COMMUNICATIONS UTILIZING INFORMATION DISPERSAL", filed Oct. 6, 2010, both of which are hereby incorporated herein by reference in their entirety and made part of the present U.S. Utility patent application for all purposes.

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

Technical Field of the Invention

This invention relates generally to computing systems and more particularly to data storage solutions within such computing systems.

Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to utilize a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failure issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

FIG. 6A is a schematic block diagram of an embodiment of a communication system in accordance with the present invention;

FIG. 6B is a table illustrating an example of a data partition in accordance with the present invention;

FIG. 7A is a flowchart illustrating an example of sending data in accordance with the present invention;

FIG. 7B is a flowchart illustrating an example of receiving data in accordance with the present invention;

FIG. 13 is a flowchart illustrating another example of sending data as slices in accordance with the present invention;

FIG. 20A is a flowchart illustrating another example of sending data as slices in accordance with the present invention;

FIG. 20B is a flowchart illustrating another example of re-routing data in accordance with the present invention;

DETAILED DESCRIPTION OF THE INVENTION

Figure 1:
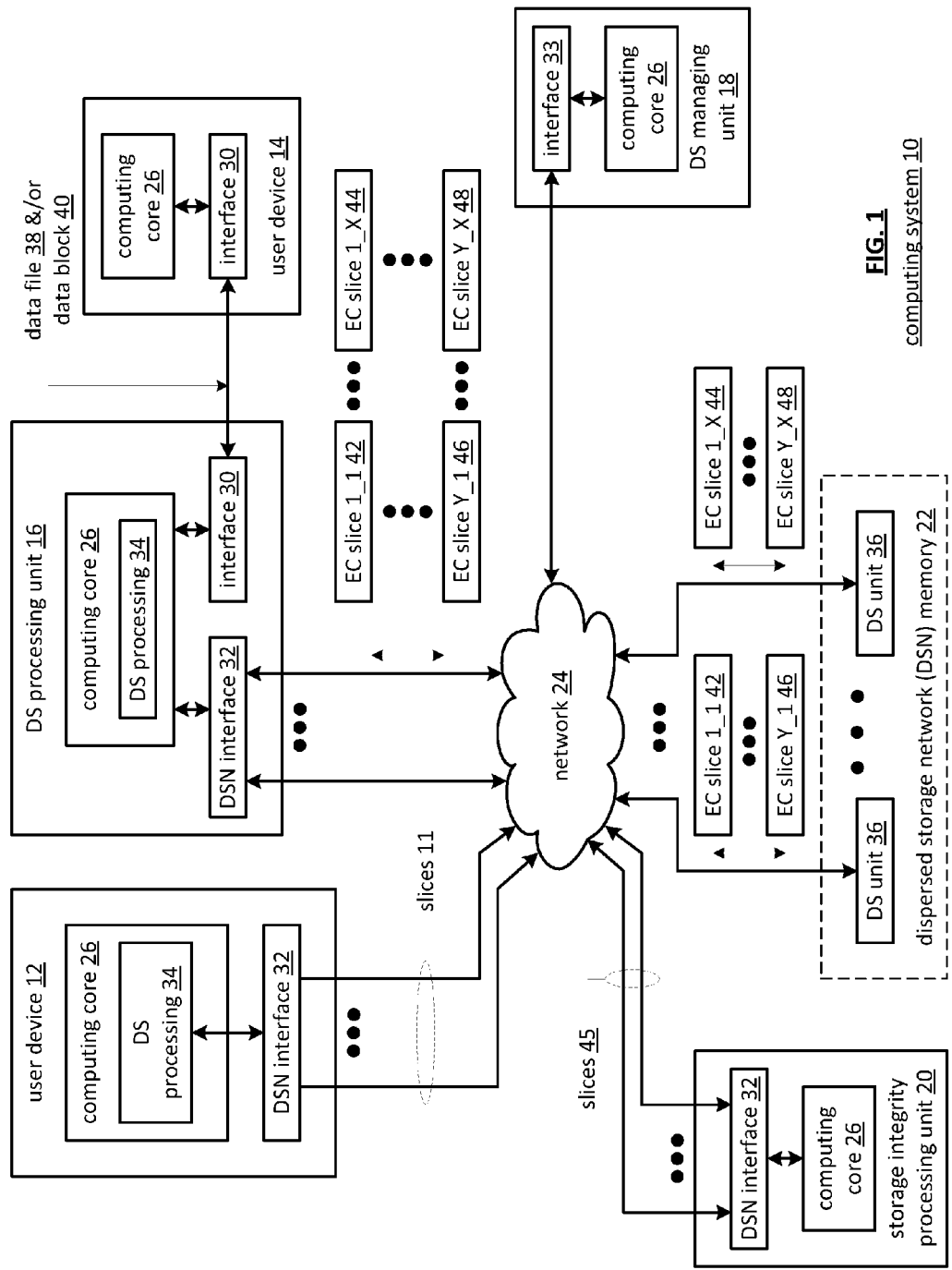
FIG. 1 is a schematic block diagram of an embodiment of a computing system in accordance with the present invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module executes, hard coded and/or operational instructions corresponding to at least some of the steps and/or functions illustrated in FIGS. 1-24.

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 and/or directly. For example, interface 30 supports a communication link (wired, wireless, direct, via a LAN, via the network 24, etc.) between the first type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing unit 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times a user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices' and/or units' activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it sends the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each EC slice 42-48, the DS processing unit 16 creates a unique slice name and appends it to the corresponding EC slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the EC slices 42-48 for transmission via the network 24.

The number of DS units 36 receiving the EC slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improve data storage integrity and security. Further examples of encoding the data segments will be provided with reference to one or more of FIGS. 2-24.

Each DS unit 36 that receives an EC slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuilt slice, or slices, in the appropriate DS unit(s) 36 in a manner that mimics the write process previously described.

Figure 2:
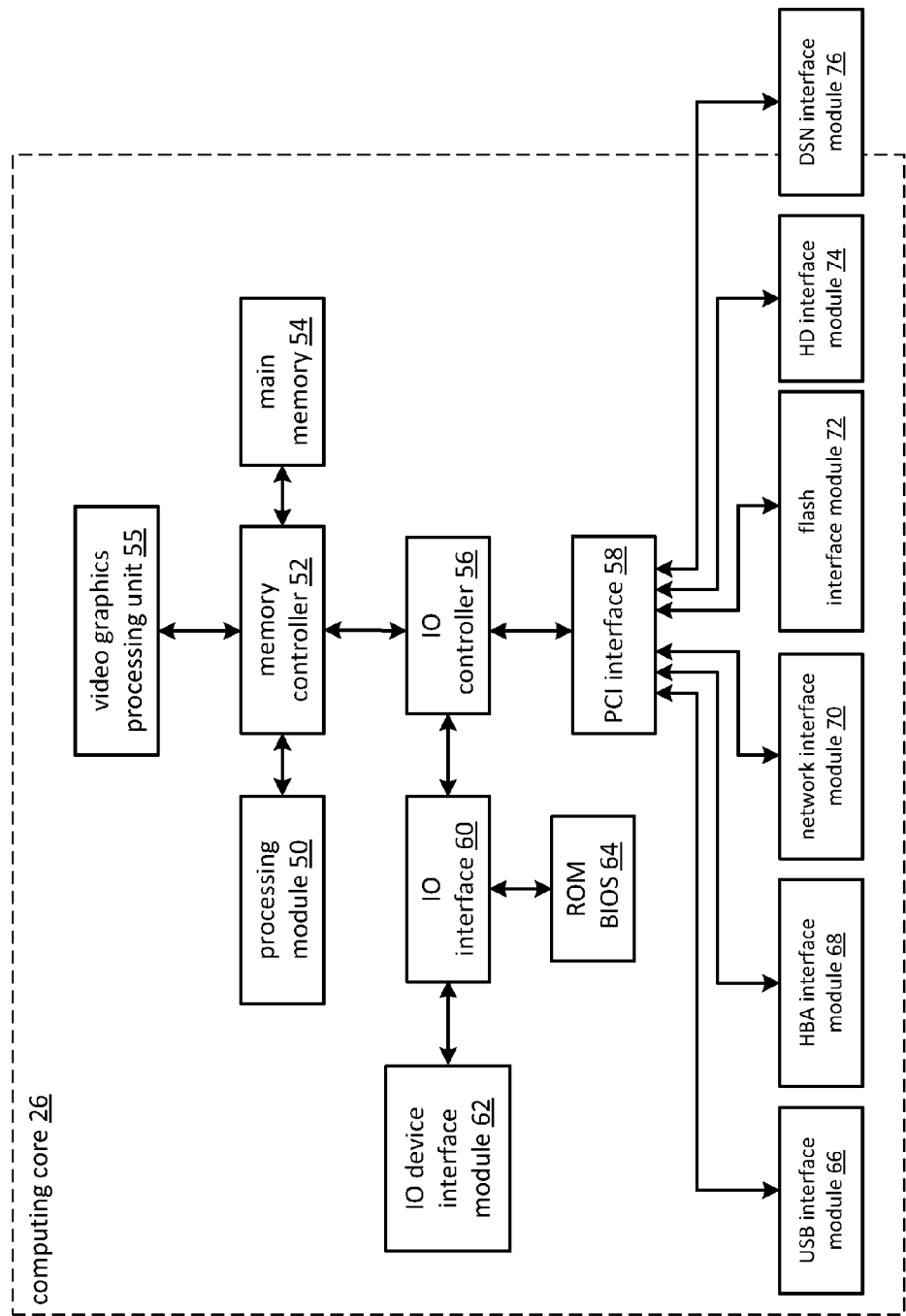
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface 60, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

The processing module 50 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 50 may have an associated memory and/or memory element, which may be a single memory device, a plurality of memory devices, and/or embedded circuitry of the processing module 50. Such a memory device may be a read-only memory, random access memory, volatile memory, non-volatile memory, static memory, dynamic memory, flash memory, cache memory, and/or any device that stores digital information. Note that if the processing module 50 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 50 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 50 executes, hard coded and/or operational instructions corresponding to at least some of the steps and/or functions illustrated in FIGS. 1-24.

Figure 3:
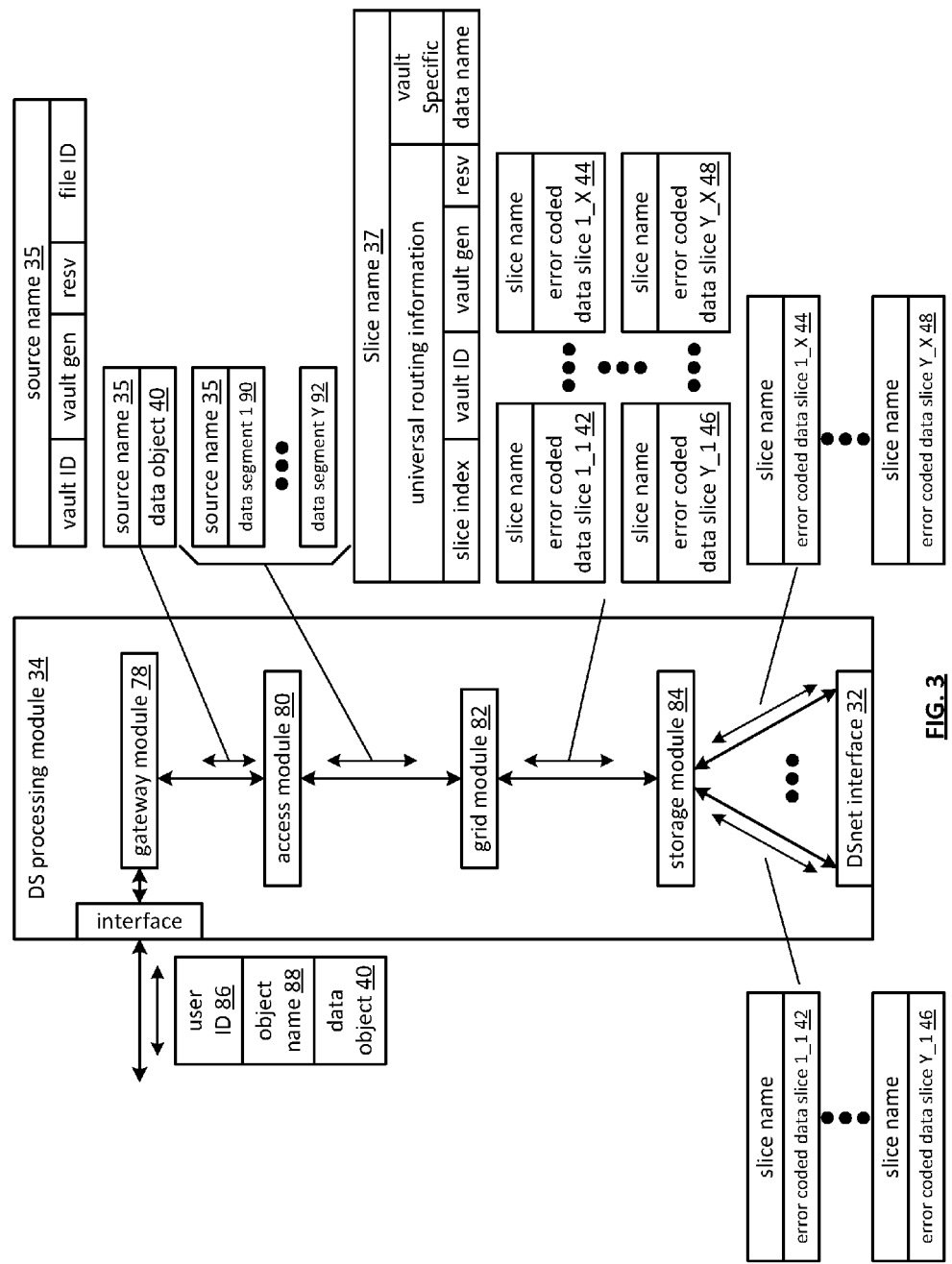
FIG. 3 is a schematic block diagram of an embodiment of a distributed storage processing unit in accordance with the present invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user device 12 or of the DS processing unit 16. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data object field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 78 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, if segment size is fixed, then the number of segments Y varies based on the size of data object. For instance, if the data object is an image file of 4,194,304 bytes and the fixed size of each segment is 4,096 bytes, then the number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal function include a read threshold T, a write threshold W, etc. The read threshold (e.g., T=10, when X=16) corresponds to the minimum number of error-free error coded data slices required to reconstruct the data segment. In other words, the DS processing module 34 can compensate for X−T (e.g., 16−10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 16, which authenticates the request. When the request is authentic, the DS processing unit 16 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

Figures 4, 5:
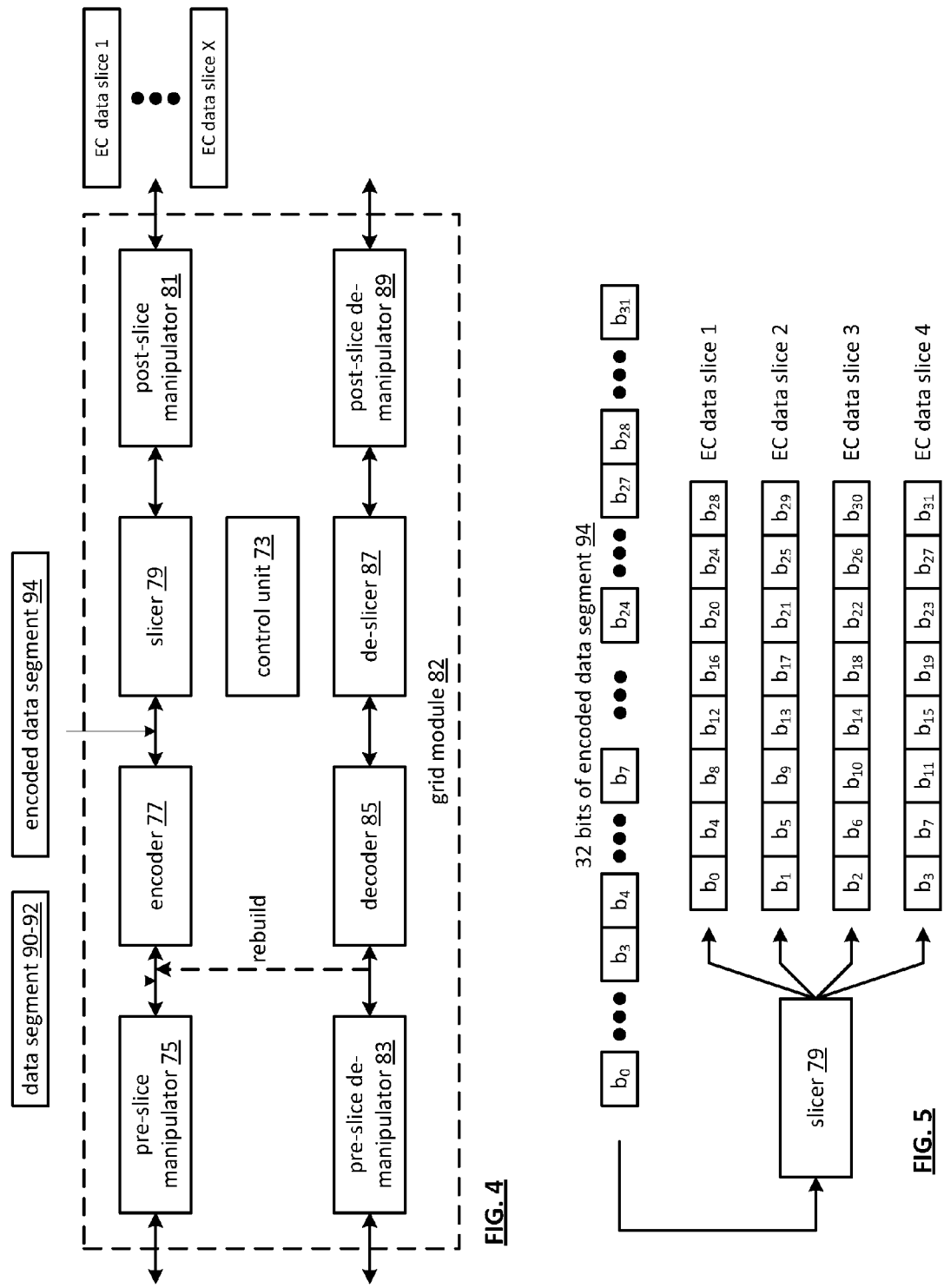
FIG. 4 is a schematic block diagram of an embodiment of a grid module in accordance with the present invention.
FIG. 5 is a diagram of an example embodiment of error coded data slice creation in accordance with the present invention.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X−T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

FIG. 6A is a schematic block diagram of an embodiment of a communication system. The system includes a sending dispersed storage (DS) processing unit 102, a network 24, and a receiving DS processing unit 104. In an implementation example, the sending DS processing unit 102 and the receiving DS processing unit 104 include a DS processing module 34. The sending DS processing unit 102 and the receiving DS processing unit 104 operate to communicate data 106. In an example of operation, the sending DS processing unit 102 obtains data 106 for transmission to the receiving DS processing unit 104. The data may include a plurality of data portions a-c. Next, sending DS processing unit 102 generates a plurality of sets of error coding dispersal storage function parameters to utilize in the generation of a plurality of sets of encoded data slices which achieves communications goals for each of the corresponding data portions a-c. For instance, a reliability goal for data portion a may be greater than a reliability goal for data portion b when receiving data portion a by the receiving DS processing unit 104 is a higher priority than receiving data portion b. Next, the sending DS processing unit 102 dispersed storage error encodes each data portion of the plurality of data portions a-c in accordance with a corresponding set of error coding dispersal storage function parameters of the plurality of sets of error coding dispersal storage function parameters to produce a plurality of sets of encoded data slices as slice sets a-c. For instance, a plurality of sets of encoded data slices corresponds to each of the three portions. For each data portion, each set of a corresponding plurality of sets of encoded data slices includes at least a decode threshold number of encoded data slices and at most a pillar width a number of encoded data slices in accordance with the communications goals. For example, the DS processing unit 102 generates a pillar width number of 32 encoded data slices to obtain a communication goal of oversampling when a decode threshold is 10 and receiving a decode threshold number of encoded data slices meets a minimum reliability communication goal.

In the example of operation continued, the sending DS processing unit 102 sends the plurality of sets of encoded data slices a-c to the receiving DS processing unit 104 via the network 24. The receiving DS processing unit 104 receives the plurality of sets of encoded data slices as receive slice sets a-c. The receive slice sets a-c may introduce slice errors as compared to slice sets a-c when network 24 experiences errors and outages. The receiving DS processing unit 104 receives the receive slice sets a-c which may include at least some slices of the encoded data slice sets a-c as sent by the sending DS processing unit 102. The receiving DS processing unit 104 dispersed storage error decodes each set of the received slices sets a-c utilizing corresponding parameters of the plurality of sets of error coding dispersal storage function parameters to reproduce data portions a-c. The receiving DS processing unit 104 aggregates the data portions a-c to reproduce the data 106.

In an instance, the receiving DS processing unit 104 successfully reproduces the data portions a-c with no errors. As another instance, the receiving DS processing unit 104 successfully reproduces less than all of the data portions a-c, wherein the receiving DS processing unit 104 fills in missing portions of one or more of the data portions a-c to produce a modified version of the data 106. For instance, the receiving DS processing unit 104 successfully reproduces data portions a and b but not data portion c. The receiving DS processing unit 104 substitutes filler bits for data portions c to produce a synthesized data portion c. The receiving DS processing unit 104 aggregates data portions a-b and the synthesized data portions c to produce a modified version of the data 106.

FIG. 6B is a table illustrating an example of a data partition 108. The data partition 108 includes a plurality of data bytes 1-X organized by a most significant bit field (e.g., six bits), a middle bit field (e.g., five bits), and a least significant bit field (e.g., five bits). For example, an audio file includes a plurality of data bytes 1-X representing 16-bit audio sampling bytes. As such, most significant bits are more important than least significant bits in a subsequent decoding process to produce a reproduced audio file that is as close as possible (e.g., with minimal distortion) to an original audio file. The three fields are associated with three data portions. For example, a data portion "a" includes the most significant bit field, wherein the most significant six bits of each of the plurality of bytes 1-X is included in data portion a. A data portion b includes the middle bit field, wherein the middle five bits of each of the plurality of bytes 1-X are included in data portion b. A data portion c includes the least significant bit field, wherein the significant five bits of each of the plurality of bytes 1-X is included in data portion c.

Note that the data portion a may be more important than the data portions c in the reproduction of the audio file. A sending dispersed storage (DS) processing unit may select three sets of error coding dispersal storage function parameters to dispersed storage error encode each of the data portions a-c to achieve one or more system goals. System goals may include one or more of reliability, speed of transmission, latency, availability, complexity, and simplicity. For example, the sending DS processing unit selects a first set of error coding dispersal storage function parameters that align with high reliability to dispersed storage error encode the data portion a. For instance, the sending DS processing unit selects the first set of parameters that include a pillar width of 15 and a decode threshold of 8. As another example, the sending DS processing unit selects a second set of error coding dispersal storage function parameters that align with more efficiency to dispersed storage error encode the data portion b. For instance, the sending DS processing unit selects the second set of parameters to include a pillar width of 12 and a decode threshold of 8. As yet another example, the sending DS processing unit selects a third set of error coding dispersal storage function parameters that align with even more efficiency to dispersed storage error encode the data portion c. For instance, the sending DS processing unit selects the third set of parameters that include a pillar width of 10 and a decode threshold of 8. The method to partition data and select error coding dispersal storage function parameters is discussed in greater detail with reference to FIG. 7A.

FIG. 7A is a flowchart illustrating an example of sending data. The method begins with step 110 where a processing module (e.g., of a sending dispersed storage (DS) processing unit) obtains data for transmission. The data may include an analog or digital representation of any one of data content, media content, video, audio, speech, word processing files, financial records, software, etc. The method continues at step 112 where the processing module partitions the data in accordance with a data partitioning scheme to produce a plurality of data portions. The processing module selects the data partitioning scheme by at least one of selecting the data partitioning scheme by determining a data characterization based on at least one of a data analysis (e.g., determine type of data such as video, audio, etc.), received data characterization information, a predetermination, a message, a look up, and a comparison of the data to other characterized data and selecting the data partitioning scheme based on at least one of the data characterization, a lookup, a partitioning policy, a predetermination, a message, and a previous data partitioning approach.

The partitioning the data includes partitioning the data into a first data portion and a second data portion, wherein the first data portion includes higher priority content of the data than the second data portion. For example, the processing module partitions the data into a first data portion that includes a most significant six bits of each byte of a plurality of bytes of the data and into a second portion that include a least significant 10 bits of each byte of the plurality of bytes of the data when each byte of the plurality of bytes includes a 16-bit audio sample. As another example, the processing module partitions the data into a first data portion that includes a base frame set of bytes of a plurality of bytes of the data and into a change frame set of bytes of the plurality of bytes of the data when the data includes compressed video.

The method continues at step 114 where the processing module dispersed storage error encodes the plurality of data portions using a plurality of sets of error coding dispersal storage function parameters to produce a plurality of sets of encoded data slices.

The processing module selects the plurality of sets of error coding dispersal storage function parameters by at least one of selecting the plurality of sets of error coding dispersal storage function parameters by determining a data characterization based on at least one of a data analysis, received data characterization information, a predetermination, a message, a look up, a comparison of the data to other characterized data, and the data partitioning approach and selecting the plurality of sets of error coding dispersal storage function parameters based on at least one of the data characterization, the data partitioning approach, a reliability requirement, a performance requirement, a lookup, a data encoding policy, a predetermination, a message, and a previous data encoding approach. For example, the processing module selects a set of error coding dispersal storage function parameters to generate a set of the plurality of sets of encoded data slices to include just a decode threshold number of encoded data slices when a received data characterization indicates that only a decode threshold number of encoded data slices are required to meet a reliability requirement. As another example, the processing module selects the set of error coding dispersal storage function parameters to generate the set of the plurality of sets of encoded data slices to include a pillar width minus 2 number of encoded data slices when the received data characterization indicates that mild oversampling is required to meet a performance requirement. For instance, the processing module utilizes oversampling when performance of a network connection between the sending DS processing unit and a receiving DS processing unit deteriorates while transmitting the data.

The method continues at step 116 where the processing module outputs the plurality of sets of encoded data slices. For sample, the processing module sends the plurality of sets of encoded data slices to the receiving DS processing unit via a network. The method continues at step 118 where the processing module provides an indication of the data partitioning scheme and the plurality of sets of error coding dispersal storage function parameters to a receiving entity. For example, the processing module sends the data partitioning scheme and the plurality of sets of error coding dispersal storage function parameters to the receiving DS processing unit. As another example, the processing module sends the data partitioning scheme and the plurality of sets of error coding dispersal storage function parameters to a dispersed storage network (DSN) for storage therein and subsequent retrieval by the receiving DS processing unit.

FIG. 7B is a flowchart illustrating an example of receiving data, wherein the data has been encoded into a plurality of sets of encoded data slices using a plurality of sets of error coding dispersal storage function parameters and a data partitioning scheme. The method begins with step 120 where a processing module (e.g., of a receiving dispersed storage (DS) processing unit) receives an indication of the data partitioning scheme and the plurality of sets of error coding dispersal storage function parameters from a transmitting entity. For example, the processing module receives a message from a sending DS processing unit, wherein the message includes the indication of the data partitioning scheme and the plurality of sets of error coding dispersal storage function parameters. As another example, the processing module retrieves the indication of the data partitioning scheme and the plurality of sets of error coding dispersal storage function parameters from a dispersed storage network (DSN) memory.

The method continues at step 122 where the processing module receives, via a network, at least a decode threshold number of encoded data slices for each set of the plurality of sets of encoded data slices. The receiving the at least a decode threshold number of encoded data slices includes determining whether an encoded data slice of the at least a decode threshold number of encoded data slices includes a bit error. The processing module discards the encoded data slice from the at least a decode threshold number of encoded data slices to produce an updated set of encoded data slices when the encoded data slice includes the bit error. Next, the processing module determines whether the updated set of encoded data slices includes at least a decodable number of encoded data slices. The processing module dispersed storage error decodes the at least a decode threshold number of encoded data slices including disperse storage error decoding the updated set of encoded data slices when the updated set of encoded data slices includes at least a decodable number of encoded data slices. The processing module utilizes data filler (e.g., bits of all zeros, bits of all ones) for the corresponding data portion when the updated set of encoded data slices does not includes at least a decodable number of encoded data slices.

The method continues at step 124 with a processing module dispersed storage error decodes the at least a decode threshold number of encoded data slices, for each set of the plurality of sets of encoded data slices, using a corresponding one of the plurality of sets of error coding dispersal storage function parameters to produce a decoded data portion. The method continues at step 126 where the processing module recaptures the data from a plurality of decoded data portions in accordance with the data partitioning scheme. For example, the processing module aggregates a first, second, and third decoded data portions, wherein the first and second decoded data portions are associated with decodable number of encoded data slices and the third decoded data portion includes data filler.

Figure 8A:
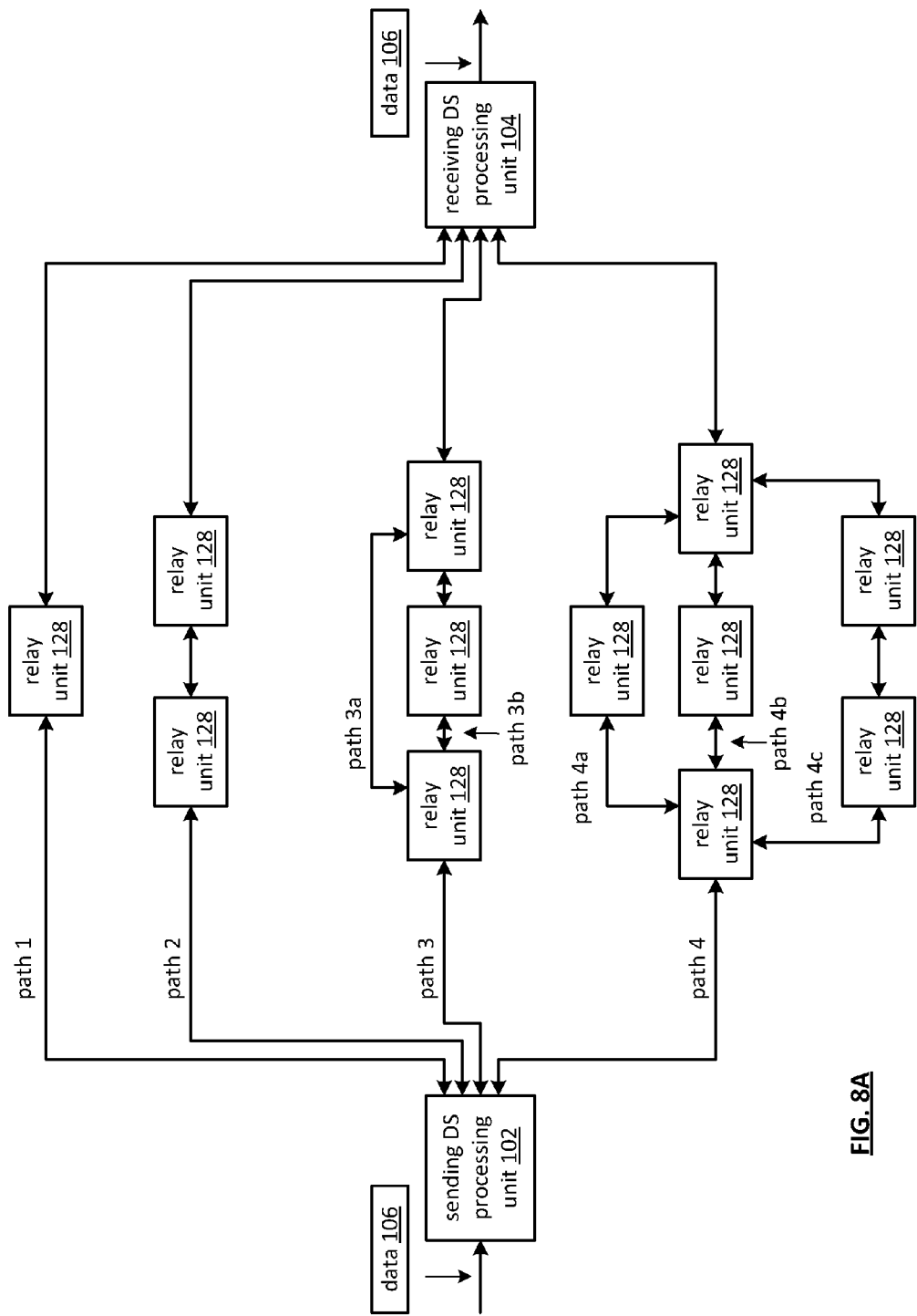
FIG. 8A is a schematic block diagram of another embodiment of a communication system in accordance with the present invention.

FIG. 8A is another schematic block diagram of another embodiment of a communication system. The system includes a sending dispersed storage (DS) processing unit 102, a plurality of relay units 128, and a receiving DS processing unit 104. In an implementation example, the sending DS processing unit 102, at least some of the plurality of relay units 128, and the receiving DS processing unit 104 include a DS processing module 34. The sending DS processing unit 102, the plurality of relay units 128, and the receiving DS processing unit 104 operate to communicate data. A plurality of routing paths 1-4 may be provided by the plurality of relay units 128 and a topology of connectivity between the sending DS processing unit 102, the plurality of relay units 128, and the receiving DS processing unit 104. Routing path 1 includes one relay unit 128 between the sending DS processing unit 102 and the receiving DS processing unit 104. Routing path 2 includes two relay units 128 between the sending DS processing unit 102 and the receiving DS processing unit 104.

A plurality of routing sub-paths may be provided by at least some of the plurality of relay units 128 and a topology of connectivity between the at least some of the plurality of relay units 128. For example, routing path 3 includes three relay units 128 between the sending DS processing unit 102 and the receiving DS processing unit 104, wherein a routing sub-path 3a includes two of the three relay units 128 and routing sub-path 3b includes all three of the three relay units 128. As another example, routing path 4 includes six relay units 128 between the sending DS processing unit 102 and the receiving DS processing unit 104, wherein routing sub-path 4a includes three of the six relay units 128, routing sub-path 4b includes three of the six relay units 128, and routing sub-path 4c includes four of the six relay units 128.

The sending DS processing unit 102 sends data 106 utilizing one or more of the plurality of routing paths 1-4 to communicate the data 106 to the receiving DS processing unit 104. In an example of operation, the sending DS processing unit 102 receives data 106. Next, the sending DS processing unit 102 determines one or more of communications requirements (e.g., a reliability level) and routing path quality of service information (e.g., reliability history, a future reliability estimate). The sending DS processing unit 102 selects a set of routing paths of the plurality of routing paths to produce a selected set of routing paths based on the communications requirements and the routing path quality of service information. Such a selected set of routing paths may include one or more sub-paths. Next, the sending DS processing unit 102 dispersed storage error encodes the data 106 to produce a plurality of sets of encoded data slices.

The sending DS processing unit 102 determines a path assignment scheme based on the communications requirements and the routing path quality of service information. The sending DS processing unit 102 assigns encoded data slices of the plurality of sets of encoded data slices corresponding to each common pillar to a corresponding path of the selected set of routing paths utilizing the path assignment scheme. The sending DS processing unit 102 sends the plurality of sets of encoded data slices to the receiving DS processing unit 104 via the selected set of routing paths in accordance with the path assignment scheme. For instance, the sending DS processing unit 102 sends more slices via path 4 than via path 1 when the sending DS processing unit 102 determines that the path 4 slices require a more reliable path than the path 1 slices. The method of operation of the sending DS processing unit 102, the plurality of relay units 128, and the receiving DS processing unit 104 is discussed in greater detail with reference to FIGS. 8B-24.

In an example of operation, the sending DS processing unit 102 (e.g. a first device) determines an error coding distributed routing protocol and transmits a set of encoded data slices (e.g., slices 11), identity of the receiving DS processing unit 104 (e.g. a second device), and the error coding distributed routing protocol to a network (e.g., plurality of relay units 128, the receiving DS processing unit 104), wherein the set of encoded data slices represents data that has been dispersed storage error encoded. The error coding distributed routing protocol includes at least one of identity of the initial plurality of routing paths, a number of routing paths, a number of sub-sets of the set of encoded data slices, the desired routing performance for one or more of the sub-sets of the set of encoded data slices, a request for multiple path transmissions of the set of encoded data slices, a capacity estimate of the initial plurality of routing paths, a priority indicator for at least one of the sub-sets, a security indicator for at least one of the sub-sets, and a performance indicator for at least one of the sub-sets.

In the example of operation continued, the network routes a plurality of sub-sets of the set of encoded data slices via an initial plurality of routing paths towards the second device in accordance with the error coding distributed routing protocol. Next, the network compares anticipated routing performance of the routing of the plurality of sub-sets with a desired routing performance (e.g., of the error coding distributed routing protocol). The comparing the anticipated routing performance includes for a link of a plurality of links of the routing path, determining the anticipated routing performance of the link, comparing the anticipated routing performance of the link with a corresponding portion of the desired routing performance, and when the comparison of the anticipated routing performance of the link with the corresponding portion of the desired routing performance is unfavorable, indicating that the comparison of the anticipated routing performance of the routing of the plurality of sub-sets with the desired routing performance is unfavorable.

In the example of operation continued, the network alters the routing path to obtain a favorable comparison when the comparison of a routing path of the initial plurality of routing paths is unfavorable. For example, the network determines the routing paths to be unfavorable when an absolute value of a difference between the anticipated routing performance and the desired routing performance is greater than a performance threshold). The altering the routing path includes dispersed storage error encoding an encoded data slice of a corresponding sub-set of the plurality of sub-sets to produce a set of encoded data sub-slices, determining a plurality of sub-routing paths, and routing the set of encoded data sub-slices to the second device via the plurality of sub-routing paths. The altering the routing path further includes at least one of selecting a lower latency routing path, selecting a higher data rate routing path, selecting a routing path with higher capacity, selecting a routing path with a lower error rate, selecting a routing path with a higher cost, selecting a higher latency routing path, selecting a lower data rate routing path, selecting a routing path with a higher error rate, selecting a routing path with a lower cost, and selecting a routing path with lower capacity.

In the example of operation continued, the receiving DS processing unit 104 receives at least some of the set of encoded data slices from the network and when at least a threshold number (e.g., a decode threshold number) of encoded data slices have been received, the DS processing unit 104 decodes the at least a threshold number of encoded data slices to reproduce the data 106.

Figure 8B:
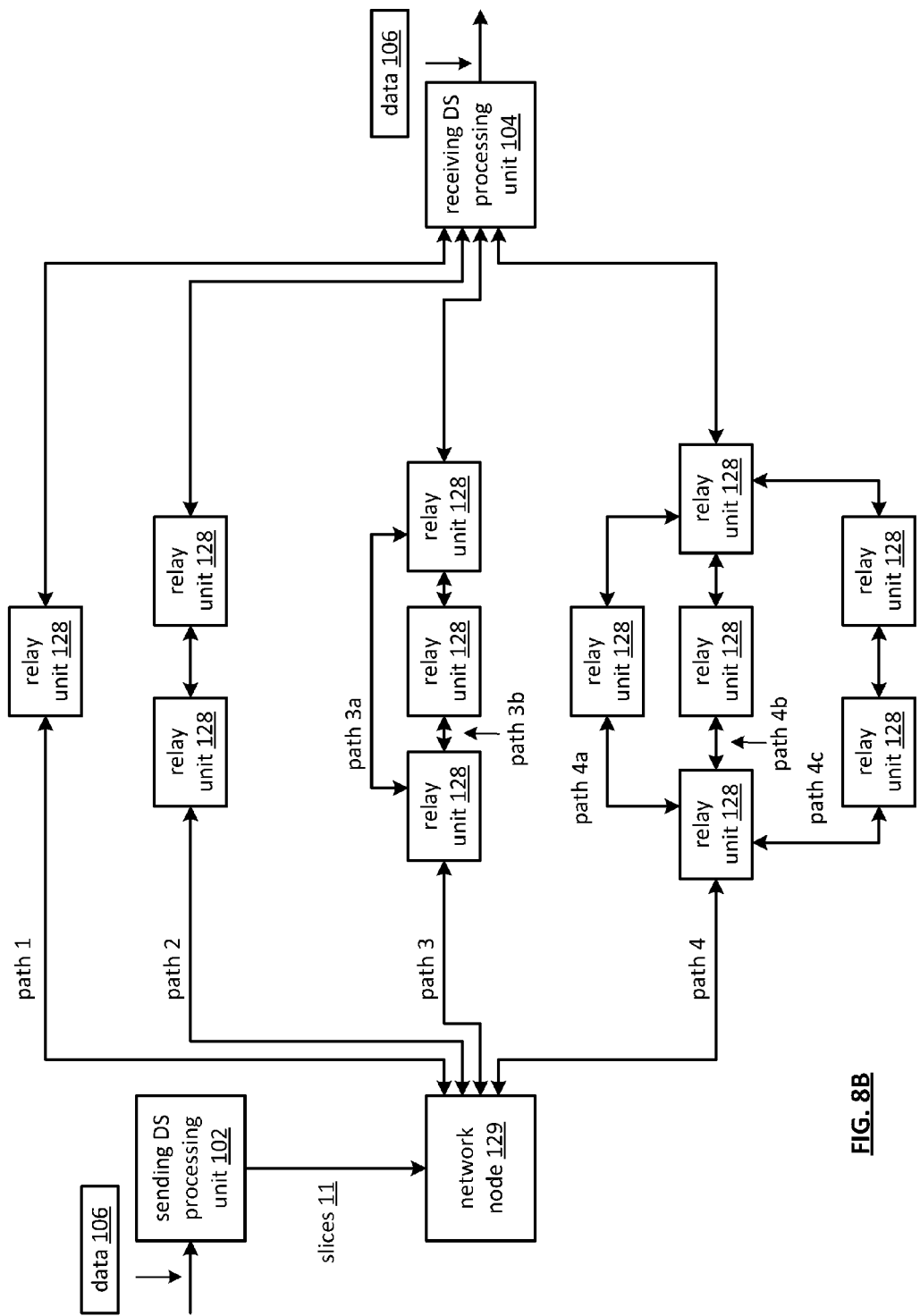
FIG. 8B is a schematic block diagram of another embodiment of a communication system in accordance with the present invention.

FIG. 8B is another schematic block diagram of another embodiment of a communication system. The system includes a sending dispersed storage (DS) processing unit 102, a network node 129, a plurality of relay units 128, and a receiving DS processing unit 104. In an implementation example, the sending DS processing unit 102, the network node 129, at least some of the plurality of relay units 128, and the receiving DS processing unit 104 include a DS processing module 34. The sending DS processing unit 102, the network node 129, the plurality of relay units 128, and the receiving DS processing unit 104 operate to communicate data. A plurality of routing paths 1-4 may be provided by the plurality of relay units 128 and a topology of connectivity between the sending DS processing unit 102, the network node 129, the plurality of relay units 128, and the receiving DS processing unit 104. Routing path 1 includes one relay unit 128 between the sending DS processing unit 102 and the receiving DS processing unit 104. Routing path 2 includes two relay units 128 between the sending DS processing unit 102 and the receiving DS processing unit 104.

A plurality of routing sub-paths may be provided by at least some of the plurality of relay units 128 and a topology of connectivity between the at least some of the plurality of relay units 128. For example, routing path 3 includes three relay units 128 between the network node 129 and the receiving DS processing unit 104, wherein a routing sub-path 3a includes two of the three relay units 128 and routing sub-path 3b includes all three of the three relay units 128. As another example, routing path 4 includes six relay units 128 between the network node 129 and the receiving DS processing unit 104, wherein routing sub-path 4a includes three of the six relay units 128, routing sub-path 4b includes three of the six relay units 128, and routing sub-path 4c includes four of the six relay units 128.

In an example of operation, the sending DS processing unit 102 (e.g. a first device) determines an error coding distributed routing protocol and transmits a set of encoded data slices (e.g., slices 11), identity of the receiving DS processing unit 104 (e.g. a second device), and the error coding distributed routing protocol to a network (e.g., the network node 129 and/or the plurality of relay units 128), wherein the set of encoded data slices represents data that has been dispersed storage error encoded. The network node 129 receives from the sending DS processing unit 102 the set of encoded data slices, identity of the receiving DS processing unit 104, and the error coding distributed routing protocol. The network node 129 routes a plurality of sub-sets of the set of encoded data slices via an initial plurality of routing paths from the sending DS processing unit 102 towards the receiving DS processing unit 104 in accordance with the error coding distributed routing protocol.

In the example continued, the network node 129 compares anticipated routing performance of the routing of the plurality of sub-sets with a desired routing performance. The comparing the anticipated routing performance includes determining the anticipated routing performance of a link of a plurality of links of the routing path, comparing the anticipated routing performance of the link with a corresponding portion of the desired routing performance, and when the comparison of the anticipated routing performance of the link with the corresponding portion of the desired routing performance is unfavorable, indicating that the comparison of the anticipated routing performance of the routing of the plurality of sub-sets with the desired routing performance is unfavorable.

In the example continued, the network node 129 alters the routing paths to obtain a favorable comparison when the comparison of a routing path of the initial plurality of routing paths is unfavorable. The altering the routing path includes dispersed storage error encoding an encoded data slice of a corresponding sub-set of the plurality of sub-sets to produce a set of encoded data sub-slices, determining a plurality of sub-routing paths, and routing the set of encoded data sub-slices to the second device via the plurality of sub-routing paths. The altering the routing path further includes at least one of selecting a lower latency routing path, selecting a higher data rate routing path, selecting a routing path with higher capacity, selecting a routing path with a lower error rate, selecting a routing path with a higher cost, selecting a higher latency routing path, selecting a lower data rate routing path, selecting a routing path with a higher error rate, selecting a routing path with a lower cost, and selecting a routing path with lower capacity.

Figure 9:
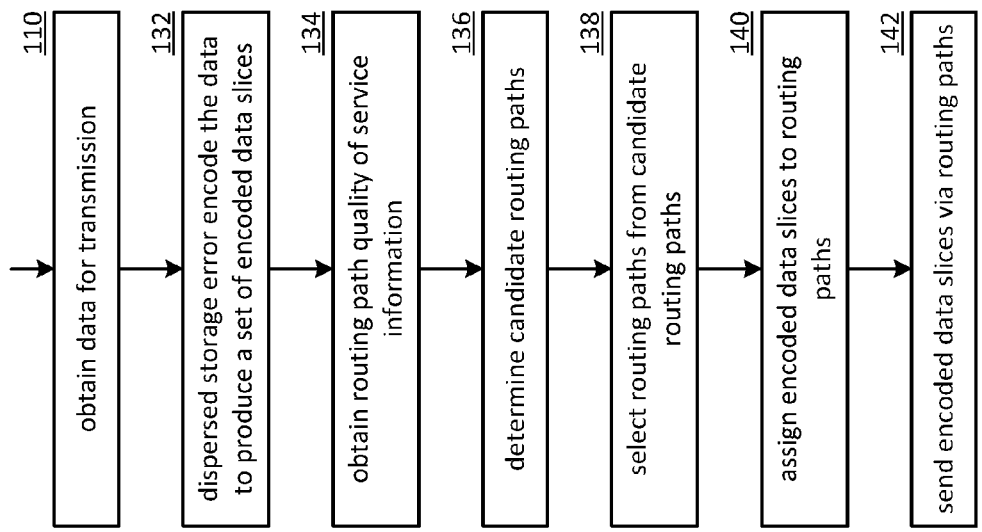
FIG. 9 is a flowchart illustrating another example of sending data as slices in accordance with the present invention.

FIG. 9 is a flowchart illustrating another example of sending data, which include similar steps to FIG. 7. The method begins with step 110 of FIG. 7 where a processing module (e.g., of a sending dispersed storage (DS) processing unit) obtains data for transmission. The method continues at step 132 where the processing module dispersed storage error encodes the data utilizing an error coding dispersal storage function to produce at least a set of encoded data slices. The method continues at step 134 where the processing module obtains routing path quality of service information. The routing path quality of service information may include one or more of latency information, reliability information, bandwidth information, speed of communications information, availability information, bit jitter information, and security information. The obtaining of the routing path quality of service information may be based on one or more of receiving the information from a relay unit, receiving information from a receiving DS processing unit, receiving information from a sending DS processing unit, a lookup, a query, a test result, historical records, and a command. For example, the processing module receives the routing path quality of service information from a receiving DS processing unit, wherein the receiving DS processing unit aggregated historical quality of service information to produce the routing path quality of service information.

The method continues at step 136 where the processing module determines candidate routing paths. The candidate routing paths represent one or more possible communications paths from the processing module to a receiving entity (e.g., the receiving DS processing unit). The determination may be based on one or more of receiving a message, a lookup, a query, a plurality of communications ping requests and responses, a test, a routing table, a message from a router, a message from a relay unit, and a command. For example, the processing module determines candidate routing paths based on a query of relay unit functionally or topologically (e.g., architecturally) between the processing module and the receiving entity. As another example, the processing module determines candidate routing paths based on receiving routing table information from one or more relay units, wherein a relay unit includes a router that generates and stores a routing table containing the routing table information.

The method continues at step 138 where the processing module selects routing paths from the candidate routing paths to produce selected routing paths. The selection may be based on one or more of the set of encoded data slices, the routing path quality of service information, the candidate routing paths, routing requirements, historical routing path performance, estimated routing path performance, a message, a lookup, a predetermination, and a command. For example, the processing module selects routing paths associated with favorable historical routing path reliability performance when a routing requirement includes high reliability. As another example, the processing module selects routing paths associated with favorable historical routing path high speed performance when a routing requirement includes high speed.

The method continues at step 140 where the processing module assigns each encoded data slice of the least a set of encoded data slices to the routing paths. The assigning may be based on one or more of the encoded data slices, the routing path quality of service information, the candidate routing paths, the selected routing paths, routing requirements, historical routing path performance, estimated routing path performance, a message, a lookup, a predetermination, and a command. For example, the processing module assigns encoded data slices associated with information bytes to routing paths associated with high speed and high reliability. As such, this selection may provide a system improvement enabling data to be decoded more quickly by the receiving entity when there no slice errors are generated during transmission of the encoded data slices. As another example, the processing module assigns encoded data slices associated with parity bytes to routing paths associated with lower speeds. As such, this alternate selection may provide a system communication reliability improvement when slice errors are generated during transmission of encoded data slices associated with information bytes and a decode threshold number of total encoded data slices are received by the receiving entity. The method continues at step 142 where the processing module sends the at least a set of encoded data slices to the receiving entity via the selected routing paths utilizing the encoded data slice to routing path assignments.

Figure 10:
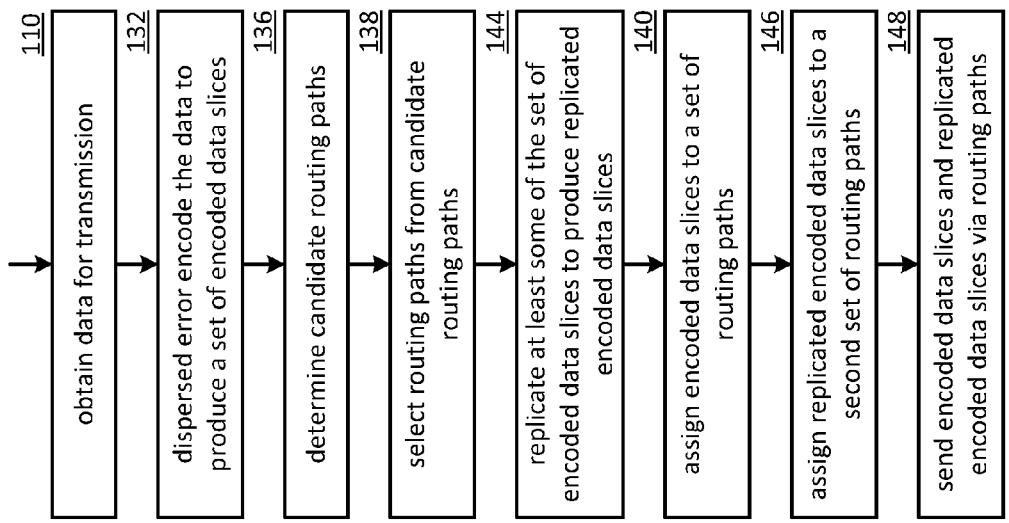
FIG. 10 is a flowchart illustrating another example of sending data as slices in accordance with the present invention.
Figure 11:
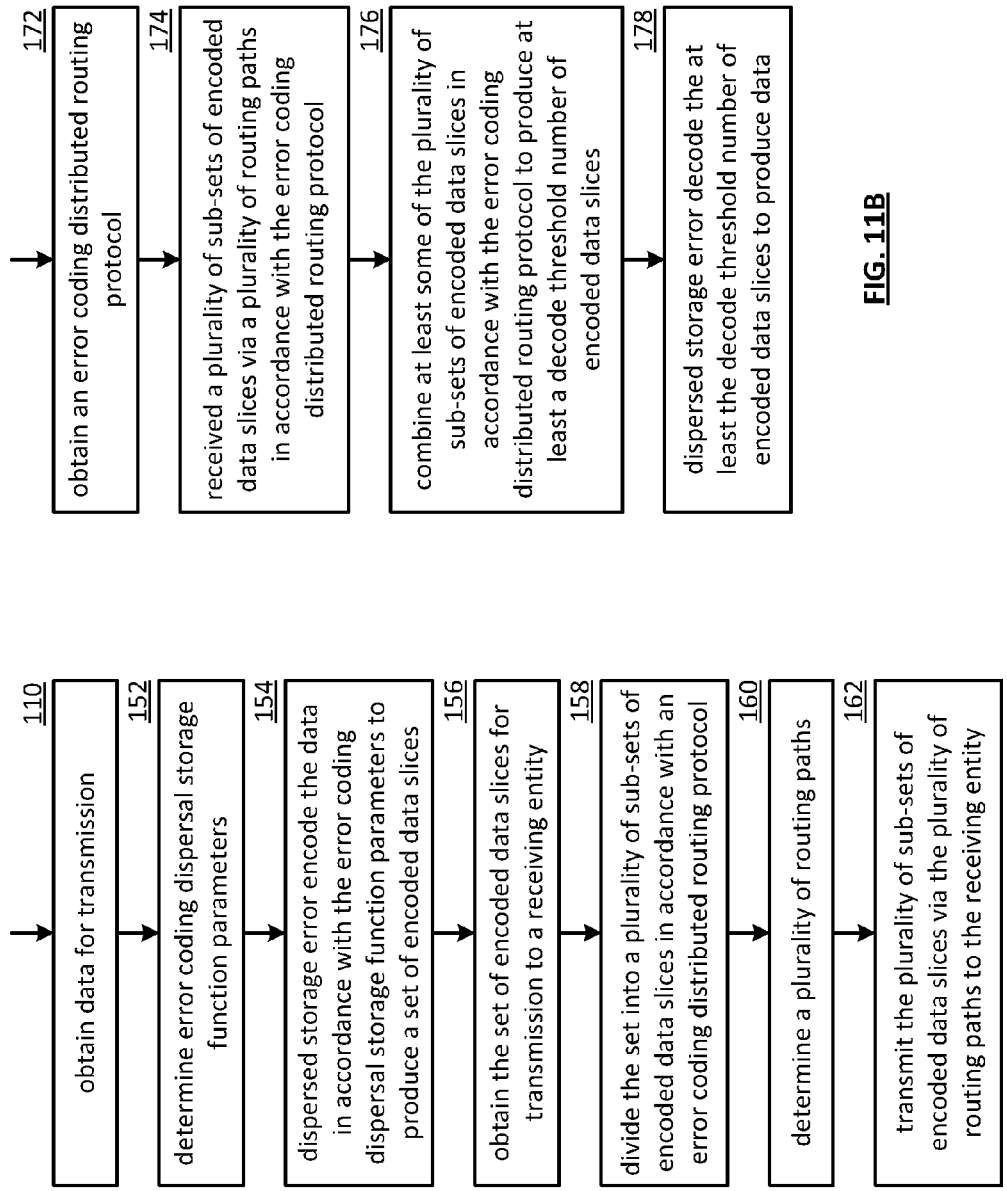
FIG. 11A is a flowchart illustrating another example of sending data as slices in accordance with the present invention.
FIG. 11B is a flowchart illustrating an example of receiving data as slices in accordance with the present invention.

FIG. 10 is a flowchart illustrating another example of sending data, which include similar steps to FIGS. 7 and 9. The method begins with step 110 of FIG. 7 where a processing module (e.g., of a sending dispersed storage (DS) processing unit) obtains data for transmission and continues with steps 132, 136, and 138 of FIG. 9 where the processing module dispersed error encodes the data to produce at least a set of encoded data slices, determines candidate routing paths, and selects routing paths from the candidate routing paths.

The method continues at step 144 where the processing module replicates at least some of the set of encoded data slices to produce replicated encoded data slices. The processing module selects the at least some of the set of encoded data slices based on one or more of the encoded data slices, the quality of service information, the candidate routing paths, the selected routing paths, a priority indicator, a security indicator, a performance indicator, an estimated routing path performance indicator, a lookup, and a message. For example, the processing module selects encoded data slices that are associated with higher priority content such as header information or directory information based on a priority indicator.

The method continues with step 140 of FIG. 9 where the processing module assigns the encoded data slices to set of routing paths. The method continues at step 146 where the processing module assigns the replicated encoded data slices to a second set of routing paths. The assigning may be based on one or more of the replicated encoded data slices, the encoded data slices, the assignment of the encoded data slices to the set of routing paths, the routing path quality of service information, the candidate routing paths, the selected routing paths, routing requirements, historical routing path performance, estimated routing path performance, a message, a lookup, a predetermination, the replicated encoded data slices, a performance indicator, a priority indicator, a security indicator, and a command. For example, the processing module assigns replicated encoded data slices associated with information bytes to second routing paths associated with high speed and high reliability. Such assignment may provide a system improvement wherein the data is decoded faster by the receiving entity when there are errors in transmission of the encoded data slices containing information bytes since the replicated encoded data slices are transmitted essentially in parallel (e.g., via the second set of routing paths). As another example, the processing module assigns replicated encoded data slices associated with parity bytes to second routing paths associated with lower speeds. Such assignment may provide a system communication reliability improvement wherein the data is decoded without retransmission when slice errors occur associated with parity bytes and a decode threshold number of total slices are received by the receiving entity. The method continues at step 148 where the processing module sends the encoded data slices to the receiving entity via the set of routing paths and sends the replicated encoded data slices to the receiving entity via the second set of routing paths.

FIG. 11A is a flowchart illustrating another example of sending data, which include similar steps to FIG. 7. The method begins with the step of FIG. 7 where a processing module (e.g., of a sending dispersed storage (DS) processing unit) obtains data for transmission. The method continues at step 152 where the processing module determines error coding dispersal storage function parameters based on at least one of a data characterization, a routing approach, a reliability requirement, a performance requirement, a lookup, a data encoding policy, a predetermination, a message, and a previous data encoding approach. The method continues at step 154 where the processing module dispersed storage error encodes the data in accordance with the error coding dispersal storage function parameters to produce a set of encoded data slices.

The method continues at step 156 where the processing module obtains the set of encoded data slices for transmission to a receiving entity via a network, wherein the set of encoded data slices represents data that has been dispersed storage error encoded. The obtaining includes at least one of utilizing the set of encoded data slices, receiving the set of encoded data slices from a sending entity, retrieving the set of encoded data slices from a dispersed storage network (DSN) memory, and retrieving the set of encoded data slices.

The method continues at step 158 where the processing module divides the set into a plurality of sub-sets (e.g., one or more pillars) of encoded data slices in accordance with an error coding distributed routing protocol. The dividing the set into the plurality of sub-sets includes determining a number of sub-sets in accordance with the error coding distributed routing protocol, wherein the error coding distributed routing protocol includes at least one of routing path quality of service information, a partitioning function, a capacity estimate of the plurality of routing paths, a sub-set size indicator, a priority indicator, a security indicator, a performance indicator, an estimated routing path performance indicator, a lookup, and a message. For example, the processing module divides the set into two sub-sets, wherein a first sub-set includes encoded data slices corresponding to four pillars and a second sub-set includes encoded data slices corresponding to a remaining two pillars when a pillar width is six.

The method continues at step 160 with a processing module determines a plurality of routing paths within the network in accordance with the error coding distributed routing protocol. The determining the plurality of routing paths includes obtaining routing path quality of service information corresponding to a plurality of candidate routing paths to the receiving entity and selecting the plurality of routing paths from the plurality of candidate routing paths based on the routing path quality of service information and the error coding distributed routing protocol.

The method continues at step 162 where the processing module transmits the plurality of sub-sets of encoded data slices via the plurality of routing paths to the receiving entity in accordance with the error coding distributed routing protocol. For example, the processing module transmits the first sub-set of encoded data slices utilizing a routing path that is twice as fast as other paths based on an estimated routing path performance indicator. As another example, the processing module transmits the second sub-set of encoded data slices utilizing a routing path that is half as fast as a fastest path based on an estimated routing path performance indicator. Such a method may provide a system improvement wherein data is decoded faster by a receiving entity when the encoded data slices communicated via the two sub-sets arrive at the receiving entity at approximately a same time.

In addition, the processing module may obtain a second set of encoded data slices for transmission to the receiving entity via the network, divide the second set into a second plurality of sub-sets of encoded data slices in accordance with the error coding distributed routing protocol, wherein a sub-set of the plurality of sub-sets includes one or more like pillar number encoded data slices as a corresponding sub-set of the second plurality of sub-sets, determine a second plurality of routing paths within the network in accordance with the error coding distributed routing protocol, and transmit the second plurality of sub-sets of encoded data slices via the second plurality of routing paths to the receiving entity in accordance with the error coding distributed routing protocol.

FIG. 11B is a flowchart illustrating an example of receiving data as slices. The method begins with step 172 where a processing module (e.g., of a receiving dispersed storage (DS) processing unit) obtains an error coding distributed routing protocol that includes at least one of routing path quality of service information, a partitioning function, a capacity estimate of the plurality of routing paths, a sub-set size indicator, a priority indicator, a security indicator, a performance indicator, an estimated routing path performance indicator, a lookup, and a message. The obtaining includes at least one of receiving the error coding distributed routing protocol from a sending entity and retrieving the error coding distributed routing protocol.

The method continues at step 174 where the processing module receives a plurality of sub-sets of encoded data slices via a plurality of routing paths within a network from a sending entity in accordance with the error coding distributed routing protocol. The method continues at step 176 where the processing module combines at least some of the plurality of sub-sets of encoded data slices in accordance with the error coding distributed routing protocol to produce at least a decode threshold number of encoded data slices.

For example, the processing module combines a first sub-set of the plurality of sub-sets of encoded data slices with a second sub-set of the plurality of sub-sets of encoded data slices to produce the at least the decode threshold number of encoded data slices when the first sub-set includes encoded data slices corresponding to pillars one, two, and three, the second sub-set includes encoded data slices corresponding to pillar four, and the decode threshold number is four. As another example, the processing module utilizes a third sub-set of the plurality of sub-sets of encoded data slices to produce the at least the decode threshold number of encoded data slices when the third sub-set includes encoded data slices corresponding to pillars one, two, three, and four and the decode threshold number is four. The method continues at step 178 where the processing module dispersed storage error decodes the at least a decode threshold number of encoded data slices to produce data.

Figure 12:
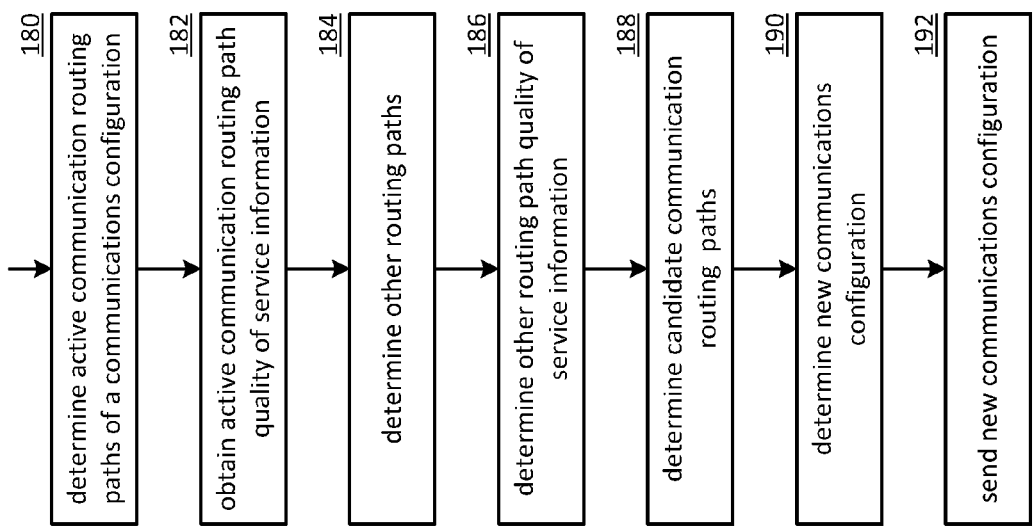
FIG. 12 is a flowchart illustrating an example of determining a communications configuration in accordance with the present invention.

FIG. 12 is a flowchart illustrating an example of determining a communications configuration. The method begins at step 180 where a processing module (e.g., a sending dispersed storage (DS) processing unit and/or a receiving DS processing unit) determines active communication routing paths of a communications configuration. Such a communications configuration may include one or more of one or more sending DS processing units, one or more receiving DS processing units, a plurality of relay units, a communications network, a topology of interconnectivity between units, a routing path capacity indicator, a routing paths latency indicator, a routing path speed indicator, and operational information. The active communications routing paths may include a list of routing paths and associations to current communications. For example, a routing path 4a has an association with a sending DS processing unit 2, wherein the sending DS processing unit 2 sends encoded data slices of pillar 6 to a receiving DS processing unit 9 via the routing path 4a. The determination of the active communication routing paths may be based on one or more of a query, a list, a test, a measurement, a DS managing unit update, a message from a sending DS processing unit, a message from a receiving DS processing unit, a message from a relay unit, and a command. For example, the processing module determines the active communication routing paths based on a message from sending DS processing unit 2 and a message from relay unit 4.

The method continues at step 182 where the processing module obtains active communication routing path quality of service information. The obtaining may be based on one or more of receiving the information from a relay unit that is a member of the routing path, receiving information from a receiving DS processing unit that is a member of the routing path, receiving information from a sending DS processing unit that is a member of the routing path, a lookup, a query, a test result, historical records, and a command. For example, the processing module receives the active communications routing path quality of service information from a receiving DS processing unit, wherein the receiving DS processing unit aggregated historical quality of service information to produce the active communication routing path quality of service information.

The method continues at step 184 where the processing module determines other routing paths. The other routing paths may include alternative paths to the active communications routing paths that may also provide interconnectivity between a sending DS processing unit and a targeted receiving DS processing unit. The determination may be based on one or more of the communications configuration, the active communication routing paths, receiving a message, a lookup, a query, a plurality of communications ping requests and responses, a test, a routing table, a message from a router, a message from a relay unit, and a command.

The method continues at step 186 where the processing module obtains other routing path quality of service information. The obtaining may be based on one or more of the active communications routing path quality of service information, the active communication routing paths, the other routing paths, receiving the information from a relay unit, receiving information from a receiving DS processing unit, receiving information from a sending DS processing unit, a lookup, a query, a test result, historical records, and a command. For example, the processing module determines the other routing path quality of service information based on receiving a message from a receiving DS processing unit, wherein the receiving DS processing unit aggregated historical quality of service information to produce the other routing path quality of service information.

The method continues at step 188 where the processing module determines candidate routing paths to support the needs of the communications configuration. The candidate routing paths represent one or more communications paths from one or more senders (e.g., a sending DS processing unit) to one or more receiving entities (e.g., a receiving DS processing unit). The determination may be based on one or more of the communications configuration, the active communications routing path quality of service information, the other routing paths, the other routing path quality of service information, a communications requirement, an estimated routing path performance, receiving a message, a lookup, a query, a plurality of communications ping requests and responses, a test, a routing table, a message from a router, a message from a relay unit, and a command. For example, the processing module determines candidate routing paths based on a query of units functionally or topologically (e.g., architecturally) between each sender and each target of a communications configuration. As another example, the processing module determines candidate routing paths based on receiving routing table information from one or more relay units.

The method continues at step 190 where the processing module determines a new communications configuration, wherein routing paths are selected from the candidate communication routing paths to optimize the communication of data from one or more sending DS processing units to one or more receiving DS processing units. The determination may be based on one or more of the communications configuration, the active communications routing path quality of service information, the other routing paths, the other routing path quality of service information, the candidate communications routing paths, a communications requirement, an estimated candidate routing path performance, receiving a message, a lookup, a query, a plurality of communications ping requests and responses, a test, a routing table, a message from a router, a message from a relay unit, and a command. For example, the processing module determines the new communications configuration based on an estimated candidate routing path performance that meets or exceeds a communications requirement. The method continues at step 192 where the processing module sends the new communications configuration to one or more sending DS processing units, one or more relay units, one or more receiving DS processing units. Alternatively, or in addition to, the processing module may send the quality of service information associated with the selected routing paths of the candidate communication routing paths.

FIG. 13 is a flowchart illustrating another example of sending data as slices, which include similar steps to FIGS. 7, 9, and 11A. The method begins with step 110 of FIG. 7 where a processing module (e.g., of a sending dispersed storage (DS) processing unit) obtains data for transmission. The method continues with steps 136-138 of FIG. 9 where the processing module determines candidate routing paths, obtains routing path quality of service information and selects routing paths from the candidate routing paths.

The method continues with steps 152-154 of FIG. 11A where the processing module determines error coding dispersal storage function parameters and dispersed storage error encodes the data utilizing an error coding dispersal storage function in accordance with the error coding dispersal storage function parameters to produce a set of encoded data slices. For example, the processing module determines the error coding dispersal storage function parameters to include a pillar width and a threshold set for each data segment based on the routing path quality of service information and the communications requirement. For instance, the processing module selects a pillar width of 10 and a decode threshold of 8 when the communications requirement includes a high-efficiency requirement. As another instance, the processing module selects a pillar width of 15 and a decode threshold of 8 when the communications requirement includes a high-reliability requirement. The method continues with steps 140-142 of FIG. 9 where the processing module assigns the set of encoded data slices to the selected routing paths and sends the set of encoded data slices via the routing paths.

Figure 14A:
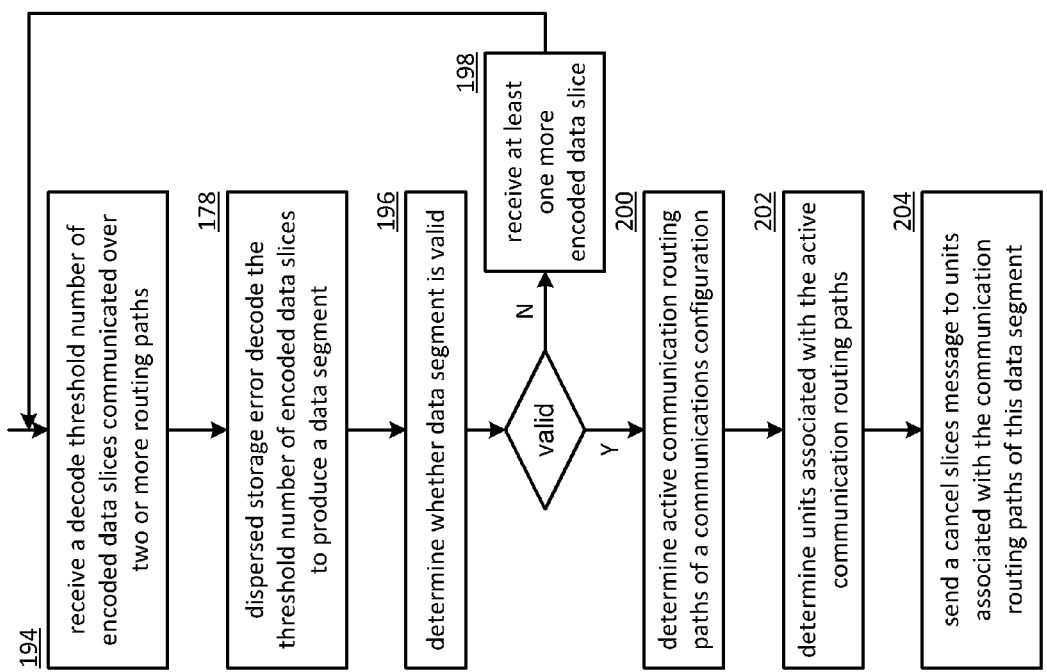
FIG. 14A is a flowchart illustrating an example of receiving data in accordance with the present invention.

FIG. 14A is a flowchart illustrating an example of receiving data, which includes similar steps to FIG. 11B. The method begins at step 194 where a processing module (e.g., a receiving dispersed storage (DS) processing unit) receives a decode threshold number of encoded data slices communicated over two or more routing paths. The method continues with step 178 of FIG. 11B where the processing module dispersed storage error decodes the decode threshold number of encoded data slices to produce a data segment. In addition, the processing module may obtain (e.g., receive or decode) a stored data segment integrity check indicator. The method continues at step 196 where the processing module determines whether the data segment is valid. The determination may be based on one or more of the stored data segment integrity check indicator, calculating an integrity check value based on the data segment to produce a calculated integrity check value, and determining if the stored data segment integrity check indicator compares favorably (e.g., substantially the same) to the calculated integrity check value. The method branches to step 200 when the processing module determines that the data segment is valid. The method continues to step 198 when the processing module determines that the data segment is not valid. The method continues at step 198 where the processing module receives at least one more encoded data source. The method repeats back to step 194 where the processing module receives the decode threshold number of encoded data slices communicated over two or more routing paths.

The method continues at step 200 where the processing module determines active communication routing paths of a communications configuration when the processing module determines that the data segment is valid. The determination may be based on one or more of routing paths associated with the threshold number of encoded data slices, a query, a list, a test, a measurement, a DS managing unit update, a message from a sending DS processing unit, a message from a receiving DS processing unit, a message from a relay unit, and a command. For example, the processing module determines the active communication routing paths based on a message from sending DS processing unit 2 and a message from relay unit 4 indicating that encoded data slices of pillar 3 are communicated via routing path 3*a*.

The method continues at step 202 where the processing module determines units associated with the active communication routing paths. The units may include a plurality of relay units associated with the active communication routing paths. The determination may be based on one or more of the communications configuration, one or more of routing paths associated with the threshold number of encoded data slices, a query, a list, a test, a measurement, a DS managing unit update, a message from a sending DS processing unit, a message from a receiving DS processing unit, a message from a relay unit, and a command. For example, the processing module determines the units associated with the active communication routing paths based on receiving the communications configuration information from a sending DS processing unit. The method continues at step 204 where the processing module sends a cancel slices message to the units associated with the communication routing paths of this data segment. Such a step may provide a system efficiency improvement by eliminating unnecessary transmission of encoded data slices.

Figure 14B:
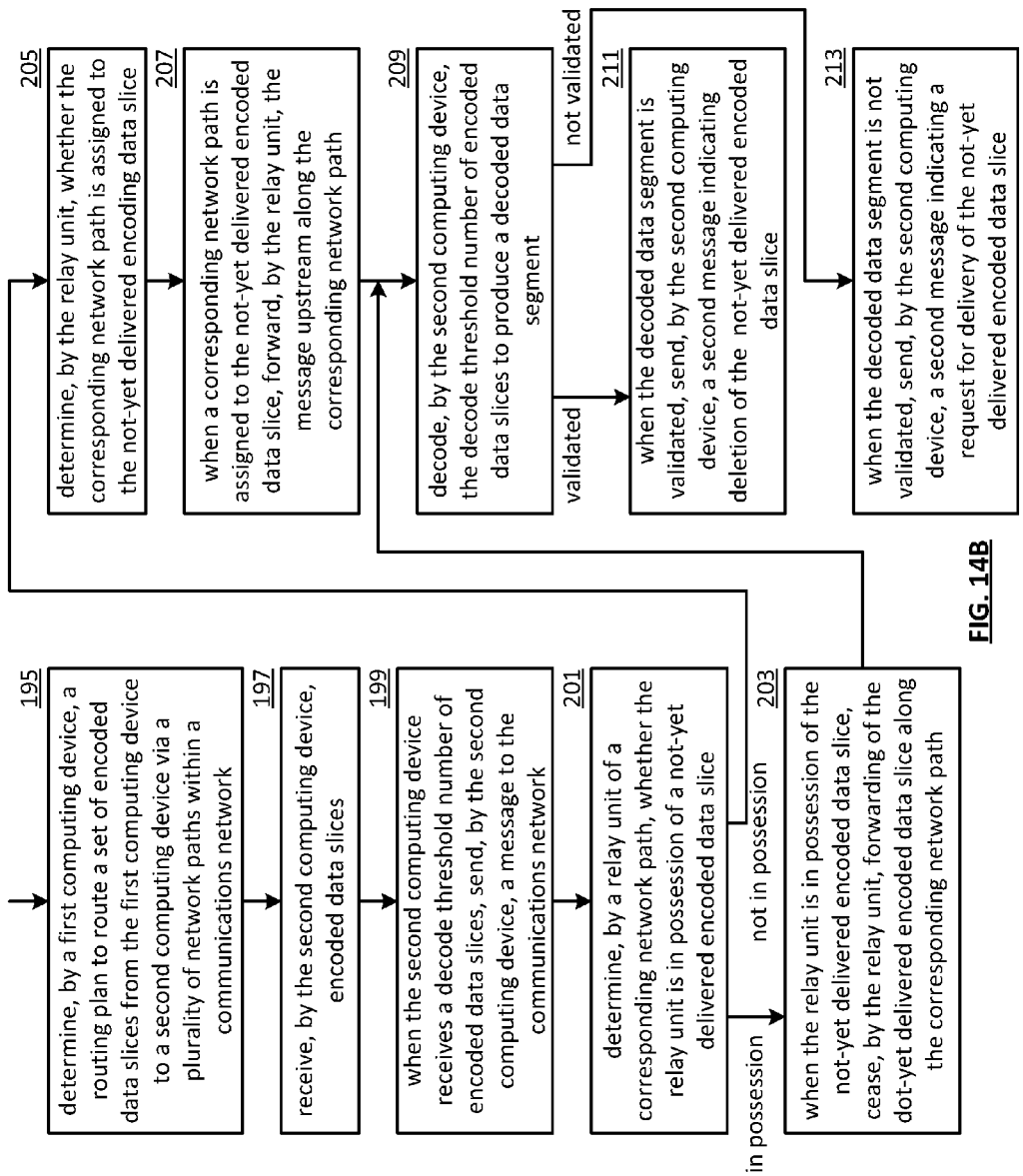
FIG. 14B is a flowchart illustrating an example of optimizing routing of data across a communications network in accordance with the present invention.

FIG. 14B is a flowchart illustrating an example of optimizing routing of data across a communications network and/or a dispersed storage network (DSN). In particular, a method is presented for use in conjunction with one or more functions and features described in conjunction with FIGS. 1-5, 8A-B, 14A, and also FIG. 14B. The method begins with step 195 where a processing module of a first computing device of one or more computing devices and/or one or more relay units of the communications network and/or the dispersed storage network (DSN) determines a routing plan to route a set of encoded data slices from the first computing device to a second computing device of the one or more computing devices via a plurality of network paths within the communications network, where a data segment was dispersed storage error encoded to produce the set of encoded data slices. A decode threshold number of encoded data slices of the set of encoded data slices is needed to recover the data segment. The first and second computing devices are operably coupled to the communications network. Each network path of the plurality of network paths includes the one or more relay units.

The method continues at step 197 where a processing module of the second computing device receives encoded data slices of the set of encoded data slices via one or more network paths of the plurality of network paths. When the second computing device receives a decode threshold number of encoded data slices, the method continues at step 199 where the second computing device sends a message to the communications network indicating receipt of the decode threshold number of encoded data slices.

In response to receiving the message, the method continues at step 201 where a processing module of a relay unit of the one or more relay units of a corresponding network path of the plurality of network paths determines whether the relay unit is in possession of a not-yet delivered encoded data slice of the set of encoded data slices. For example, the relay unit indicates that the relay unit is in possession of the not-yet delivered encoded data slice when the relay unit identifies a slice name of the not-yet delivered encoded data slice in a local storage table of the relay unit. The method branches to step 205 when the relay unit determines that the relay unit is not in possession of the not-yet delivered encoded data slice. The method continues to step 203 when the relay unit determines that the relay unit is in possession of the not-yet delivered encoded data slice.

The method continues at step 203 where the relay unit ceases forwarding of the not-yet delivered encoded data slice along the corresponding network path when the relay unit is in possession of the not-yet delivered encoded data slice. As a specific example, when the message is indicative of a pause message, the ceasing, by the relay unit, forwarding of the not-yet delivered encoded data slice along the corresponding network path includes temporarily storing the not-yet delivered encoded data slice (e.g., maintaining storage of the non-yet encoded data slice in a local memory of the relay unit) and continuing, by the relay unit, to temporarily store the not-yet delivered encoded data slice until a further processing event occurs. The further processing event includes one or more of the relay unit deleting the not-yet delivered encoded data slice after expiration of a pause time period, receiving a second message indicating deletion of the not-yet delivered encoded data slice, and receiving a third message indicating forwarding of the not-yet delivered encoded data slice downstream along the corresponding network path.

As another specific example of the ceasing of the forwarding, the relay unit interprets the message to be a delete command regarding the not-yet delivered encoded data slice. Having interpreted the message to be the delete command, the relay unit ceases the forwarding of the not-yet delivered encoded data slice by deleting the not-yet delivered encoded data slice (e.g., by deleting the not-yet delivered encoded data slice from the local memory of the relay unit). The method branches to step 209.

The method continues at step 205 where the relay unit determines whether the corresponding network path is assigned to the not-yet delivered encoded data slice when the relay unit is not in possession of the not-yet delivered encoded data slice. For example, the relay unit interprets the routing plan and indicates that the corresponding network path is assigned to the non-yet delivered encoded data slice when the routing plan Associates the corresponding network path with the non-yet delivered encoded data slice. When the corresponding network path is assigned to the not-yet delivered encoded data slice, the method continues at step 207 where the relay unit forwards the message upstream along the corresponding network path. For example, the relay unit interprets the routing plan to identify a second relay unit upstream along the corresponding network path and forwards the message to the identified second relay unit.

Alternatively, or in addition to, the relay unit determines whether delivery of a sub-set of encoded data slices of the set of encoded data slices allocated for delivery via the corresponding network path have been delivered to the second computing unit. For example, the relay unit indicates that the delivery of the sub-set of encoded data slices of the set of encoded data slices allocated for delivery via the corresponding network path have been delivered to the second computing unit when the relay unit determines that all encoded data slices of the set of encoded data slices associated with the corresponding network path and the relay unit have already passed through the relay unit. When delivery of the sub-set of encoded data slices of the set of encoded data slices allocated for delivery via the corresponding network path have been delivered to the second computing unit, the relay unit ignores the message.

The method continues at step 209 where the second computing device decodes the decode threshold number of encoded data slices to produce a decoded data segment. The decoding may further include determining whether the decoded data segment is valid. For example, the second computing device indicates that the decoded data segment is valid when integrity checks of each of the decode threshold number of encoded data slices are favorable (e.g., a calculated integrity value is substantially the same as a stored integrity value). As another example, the second computing device indicates that the decoded data segment is valid when an integrity check of the decoded data segment is favorable (e.g., a calculated integrity value is substantially the same as a stored integrity value). The method branches to step 213 when the second computing device indicates that the decoded data segment is not validated. The method continues to step 211 when the second computing device indicates that the decoded data segment is validated.

The method continues at step 211 where the second computing device sends a second message indicating deletion of the not-yet delivered encoded data slice and other not-yet delivered encoded data slices when the decoded data segment is validated. The method continues at step 213 where the second computing device sends a second message indicating a request for delivery of the non-yet delivered encoded data slice when the decoded data segment is not validated. For example, the second computing device recovers the non-yet delivered encoded data slice to produce another decode threshold number of encoded data slices for decoding and further validity testing.

The method described above in conjunction with the processing module can alternatively be performed by other modules of the dispersed storage network or by other devices. In addition, at least one memory section (e.g., a computer readable storage medium) that stores operational instructions can, when executed by one or more processing modules of one or more computing devices of the dispersed storage network (DSN), cause the one or more computing devices to perform any or all of the method steps described above.

Figure 15:
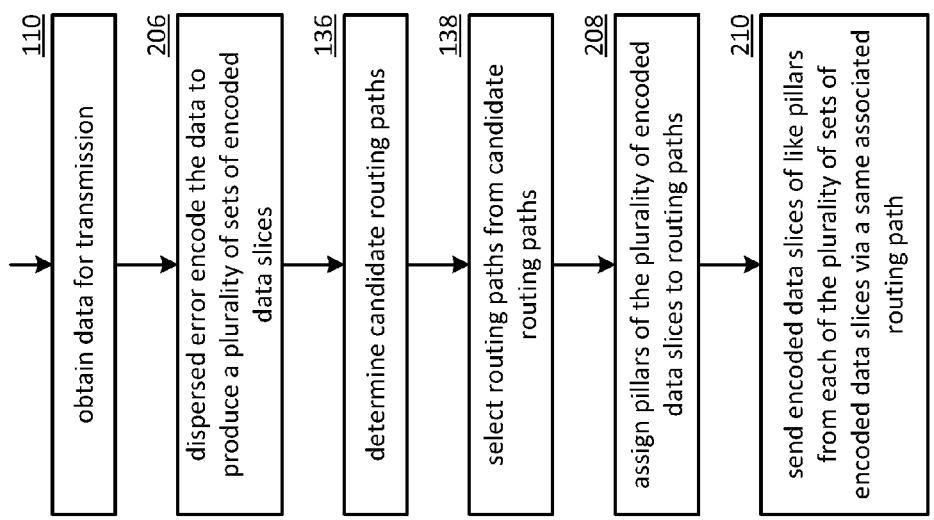
FIG. 15 is a flowchart illustrating another example of sending data as slices in accordance with the present invention.
Figure 16:
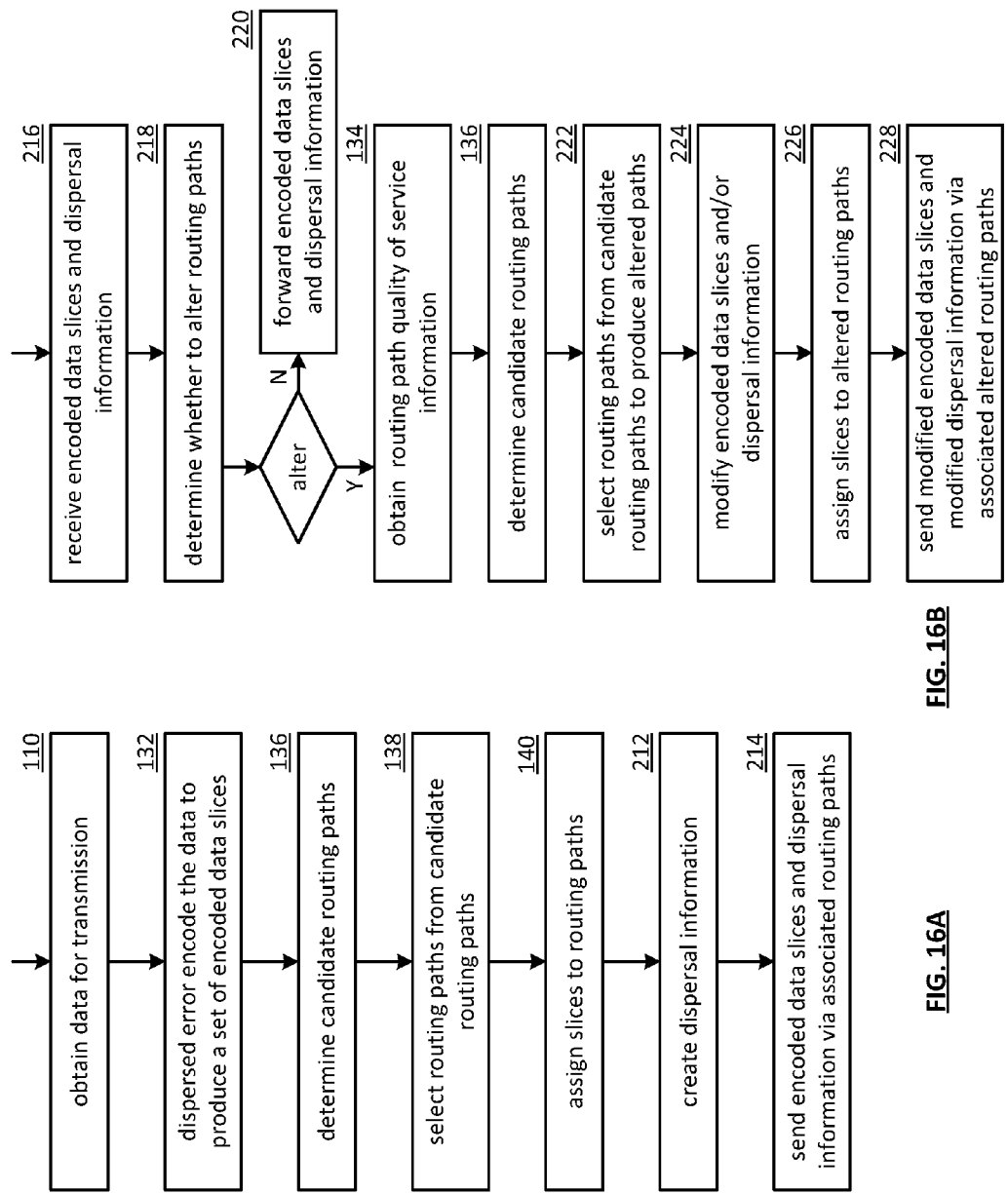
FIG. 16A is a flowchart illustrating another example of sending data as slices in accordance with the present invention.
FIG. 16B is a flowchart illustrating an example of re-routing data in accordance with the present invention.

FIG. 15 is a flowchart illustrating another example of sending data as slices, which includes similar steps to FIGS. 7 and 9. The method begins with step 110 of FIG. 7 where a processing module (e.g., of a sending dispersed storage (DS) processing unit) obtains data for transmission. The method continues at step 206 where the processing module dispersed storage error encodes the data utilizing an error coding dispersal storage function to produce a plurality of sets of encoded data slices. The method continues with steps 136-138 of FIG. 9 where the processing module obtains routing path quality of service information, determines candidate routing paths, and selects routing paths from the candidate routing paths.

The method continues at step 208 where the processing module assigns pillars of the plurality of encoded data slices to the selected routing paths. The assignment may be based on one or more of the encoded data slices, a communications performance requirement, a routing path performance estimate, routing path performance history, the routing path quality of service information, the candidate routing paths, and the selected routing paths. For example, the processing module assigns pillars 1-5 to routing path 1, pillars 6-10 to routing path 2, pillars 11-13 to routing path 3a, and pillars 14-16 to routing path 4c when a pillar width is 16, a decode threshold is 10, routing paths 1 and 2 are faster than routing paths 3a and 4c, and routing paths 3a and 4c are more reliable than routing paths 1 and 2. The processing module may assign different sets of pillars on a data segment by data segment basis. The method continues at step 210 where the processing module sends encoded data slices of like pillars from each of the plurality of sets of encoded data slices via a same associated routing path. The slices of the same pillar may be sent on just one common path.

FIG. 16A is a flowchart illustrating another example of sending data as slices, which includes similar steps to FIGS. 7 and 9. The method begins with step 110 of FIG. 7 where a processing module (e.g., of a sending dispersed storage (DS) processing unit) obtains data for transmission. The method continues with steps 136-140 of FIG. 9 where the processing module dispersed storage error encodes the data utilizing an error coding dispersal storage function to produce a set of encoded data slices, obtains routing path quality of service information, determines candidate routing paths, selects routing paths from the candidate routing paths, and assigns the set of encoded data slices to the selected routing paths.

The method continues at step 212 where the processing module creates dispersal information. The dispersal information includes one or more of the routing paths, the candidate routing paths, the routing path quality of service information, error coding dispersal storage function parameters utilized to dispersed storage error encode the data, a pillar identifier, a priority indicator, a sub-slicing indicator, a new route selection permissions indicator, a data segment identifier, a slice name, and a source name. The sub-slicing indicator may be utilized by one or more relay units to determine whether to sub-slice a received slice and select one or more new alternative routing paths to send sub-slices to a targeted receiving DS processing unit. The new route selection permissions indicator may be utilized by one or more relay units to determine whether to reselect routing paths as the encoded data slices are communicated from a sending DS processing unit to the targeted receiving DS processing unit.

The processing module may determine the new route selection permissions indicator based on one or more of a system performance indicator, a vault lookup, a user permission, a historical routing path performance indicator, a permissions list, and authorization lists, a security indicator, a priority indicator, and a performance indicator. For example, the processing module establishes the new route selection permissions indicator to exclude a relay unit from establishing a new route when the authorization lists indicates that the user is not allowed to utilize routing paths beyond an initial assignment. As another example, the processing module establishes the new route selection permissions indicator to enable the relay unit to establish a new route when a historical routing path performance indicator indicates that subsequent new route selection provides a performance improvement. The method continues at step 214 where the processing module sends the set of encoded data slices and dispersal information via the routing paths to a receiving entity.

FIG. 16B is a flowchart illustrating an example of re-routing data, which includes similar steps to FIG. 9. The method begins at step 216 where a processing module (e.g., of a relay unit) receives encoded data slices and dispersal information. The method continues at step 218 where the processing module determines whether to alter routing paths. The determination may be based on one or more of a routing permissions indicator included in the dispersal information, a vault lookup, a list, a predetermination, a routing paths quality of service indicator, an error message, and a command. For example, the processing module determines that altering the routing paths is allowed when the dispersal information includes a new route selection permissions indicator that indicates establishing a new route is allowed. The method branches to step 134 of FIG. 9 when the processing module determines to alter routing paths. The method continues to step 220 when the processing module determines not to alter routing paths. The method continues at step 220 where the processing module forwards the encoded data slices and dispersal information (e.g., in accordance with an original routing path) when the processing module determines not to alter routing paths.

The method continues with steps 134-136 of FIG. 9 where the processing module obtains routing path quality of service information and determines candidate routing paths when the processing module determines to alter routing paths. The processing module may consider currently available paths from a perspective of the processing module (e.g., the relay unit). The method continues at step 222 where the processing module selects routing paths from the candidate routing paths to produce altered paths. The processing module selects routing paths from the perspective of the processing module (e.g., the relay unit).

The method continues at step 224 where the processing module modifies the encoded data slices and/or the dispersal information. For example, the processing module modifies the dispersal information to include the altered paths. As another example, the processing module modifies the encoded data slices to include replicated encoded data slices. The method continues at step 226 where the processing module assigns a set of encoded data slices to the altered routing paths. The method continues at step 228 where the processing module sends the modified set of encoded data slices and the modified dispersal information via associated altered routing paths.

Figure 17:
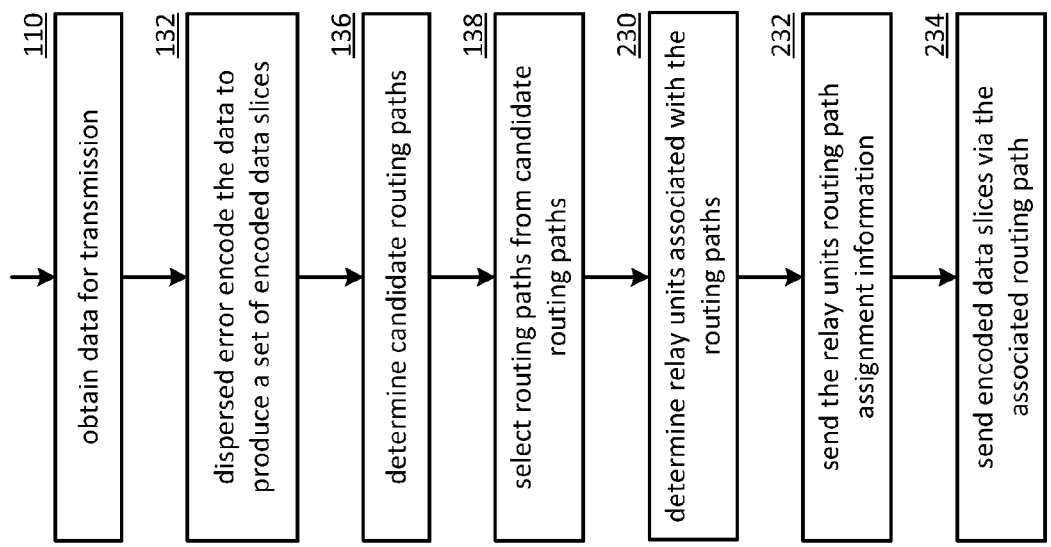
FIG. 17 is a flowchart illustrating another example of sending data as slices in accordance with the present invention.

FIG. 17 is a flowchart illustrating another example of sending data as slices, which includes similar steps to FIGS. 7 and 9. The method begins with step 110 of FIG. 7 where a processing module (e.g., of a sending dispersed storage (DS) processing unit) obtains data for transmission. The method continues with steps 132, 136, and 138 of FIG. 9 where the processing module dispersed storage error encodes the data utilizing an error coding dispersal storage function to produce a set of encoded data slices, obtains routing path quality of service information, determines candidate routing paths, and selects routing paths from the candidate routing paths.

The method continues at step 230 where the processing module determines relay units associated with the routing paths. The determination may be based on one or more of the selected routing paths, network configuration information, a communications configuration, a query, a list, a test, a measurement, a DS managing unit update, a message from a sending DS processing unit, a message from a receiving DS processing unit, a message from a relay unit, and a command. For example, the processing module determines the relay units associated with the routing paths based on receiving the communications configuration information from a sending DS processing unit. The method continues at step 232 where the processing module sends routing path assignment information to the relay units. The routing path assignment information includes one or more of a routing path identifier, a relay unit identifier, a receiving DS processing unit identifier, and a sending DS processing unit identifier. The routing path assignment information may be subsequently utilized by a relay unit to determine how to process and/or forward received encoded data slices. The method continues at step 234 where the processing module sends the encoded data slices via the associated routing paths.

Figure 18:
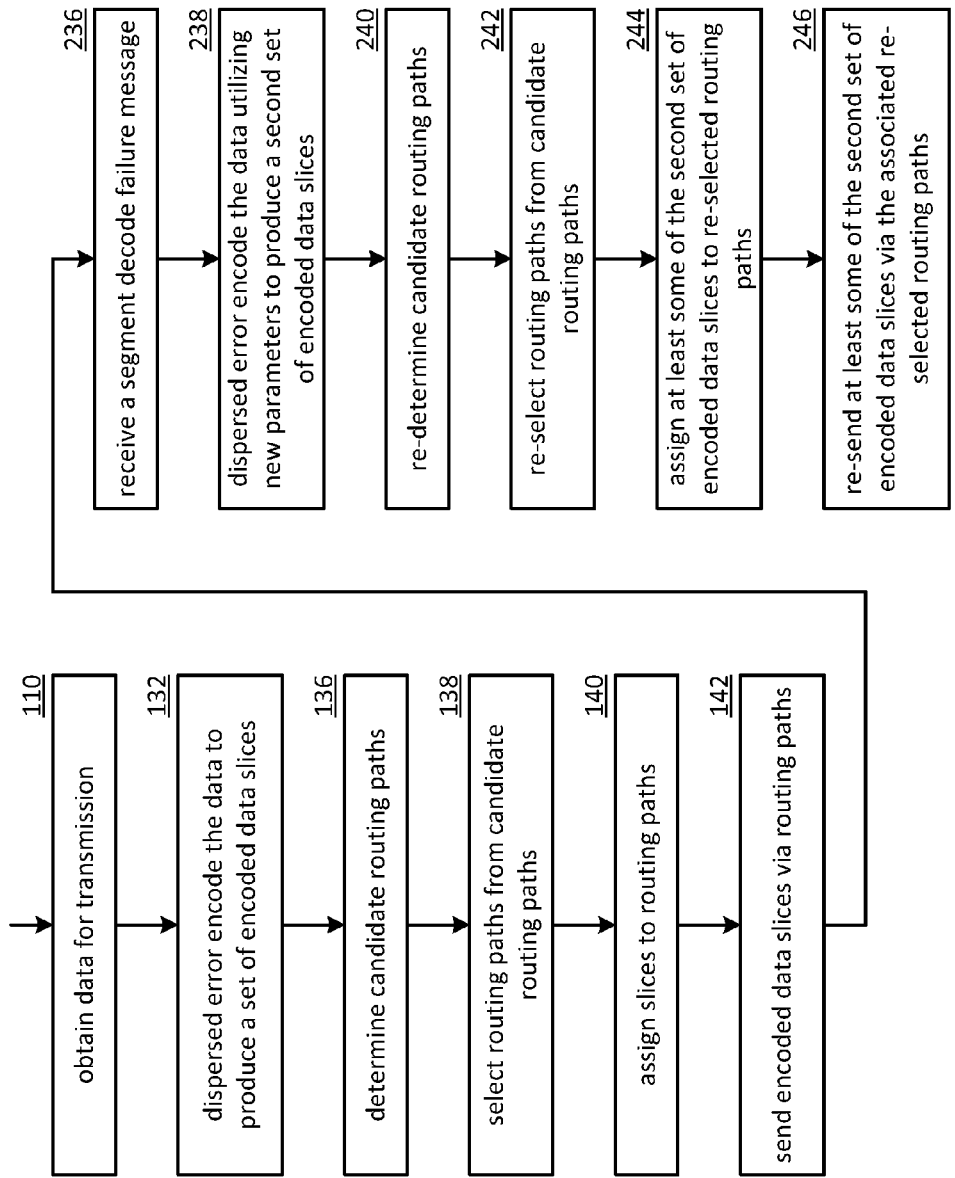
FIG. 18 is a flowchart illustrating another example of sending data as slices in accordance with the present invention.

FIG. 18 is a flowchart illustrating another example of sending data as slices, which includes similar steps to FIGS. 7 and 9. The method begins with step 110 of FIG. 7 where a processing module (e.g., of a sending dispersed storage (DS) processing unit) obtains data for transmission. The method continues with steps 132, 136, 138, 140, 142 of FIG. 9 where the processing module dispersed storage error encodes the data utilizing an error coding dispersal storage function to produce a set of encoded data slices, obtains routing path quality of service information, determines candidate routing paths, selects routing paths from the candidate routing paths, assigns a set of encoded data slices to the selected routing paths, and sends the set of encoded data slices via the routing paths. Alternatively, the processing module may not send encoded data slices of a particular pillar when processing module determines to lower network bandwidth utilization.

The method continues at step 236 where the processing module receives a segment decode failure message. The failure message may include one or more of a failure indicator, a data segment identifier, one or more slice names, a source name, a receiving DS processing unit identifier, one or more relay unit identifiers, and a routing path identifier. The method continues at step 238 where the processing module dispersed error encodes the data utilizing new error coding dispersal storage function parameters to produce a second set of encoded data slices. For example, the processing module encodes the data with new parameters where the new parameters include an additional three pillars (e.g., such that the previous slices are still usable to decode data segments).

The method continues at step 240 where the processing module re-determines candidate routing paths. The processing module may re-determine candidate routing paths to include fewer routing paths than an original number of routing. For example, the processing module re-determines candidate routing paths such that the resulting re-selected routing paths do not include any failed paths as indicated by the data segment decode failure message. The method continues at step 242 where the processing module re-selects routing paths from candidate routing paths. The processing module selects routing paths that best meet communication requirements utilizing currently available routing paths.

The method continues at step 244 where the processing module assigns at least some of the second set of encoded data slices to the re-selected routing paths. For example, the processing module assigns re-selected routing paths to the second set of encoded data slices that represent information bytes to enable improved decoding of a data segment by a receiving DS processing unit. The method continues at step 246 where the processing module re-sends at least some of the second set of encoded data slices via the associated re-selected routing paths.

In an example of operation of a receiving DS processing unit, the method begins where a processing module of the receiving DS processing unit receives a slice of a new data segment. The processing module starts a receive timer. The processing module creates and sends a data segment failure message when the timer expires and less than a decode threshold number of slices have been received. The data segment failure message may include one or more of slice names that were received, slice names that were not received, pillar identifiers of slices received, and pillar identifiers of slices not received.

Figure 19:
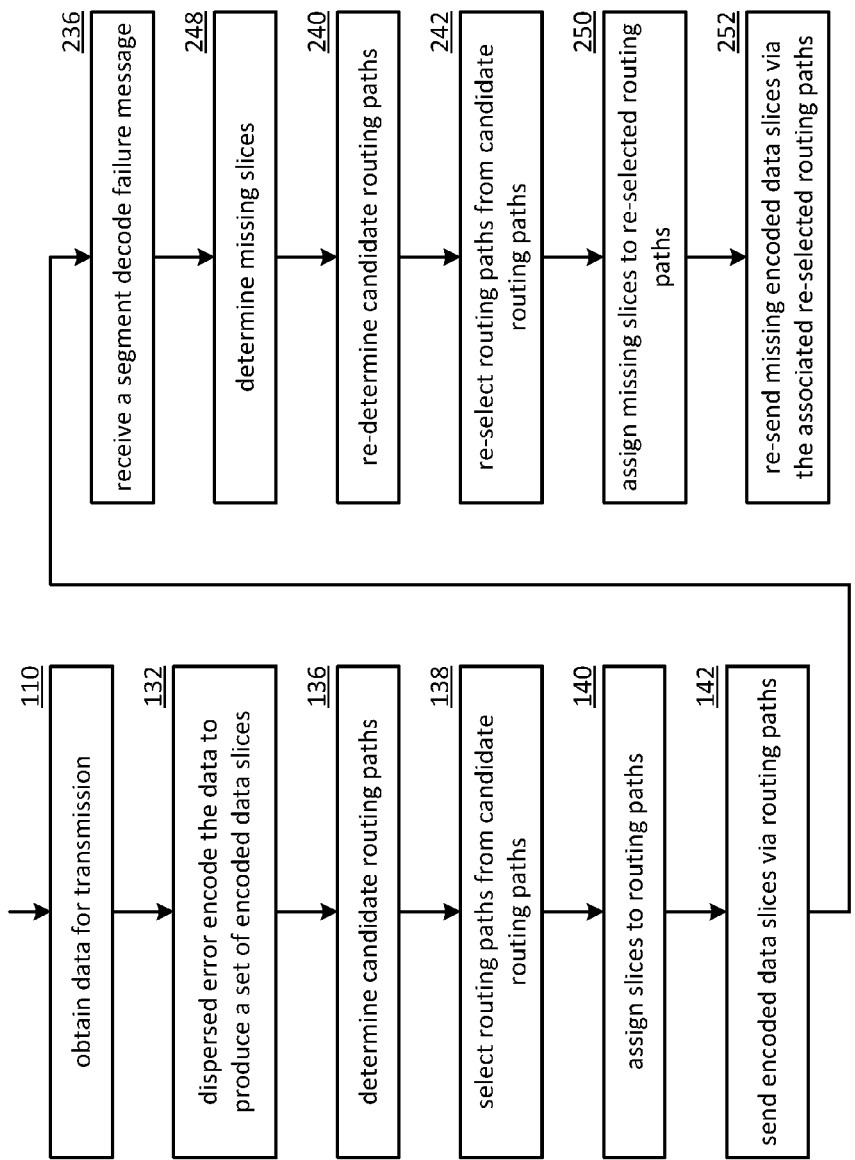
FIG. 19 is a flowchart illustrating another example of sending data as slices in accordance with the present invention.

FIG. 19 is a flowchart illustrating another example of sending data as slices, which includes similar steps to FIGS. 7, 9, and 18. The method begins with step 110 of FIG. 7 where a processing module (e.g., of a sending dispersed storage (DS) processing unit) obtains data for transmission. The method continues with steps 132, 136, 138, 140, 142 of FIG. 9 where the processing module dispersed storage error encodes the data utilizing an error coding dispersal storage function to produce a set of encoded data slices, obtains routing path quality of service information, determines candidate routing paths, selects routing paths from the candidate routing paths, assigns a set of encoded data slices to the selected routing paths, and sends the set of encoded data slices via the routing paths. The method continues with step 236 of FIG. 18 where the processing module receives a segment decode failure message.

The method continues at step 248 where the processing module determines missing slices. The missing slices includes slice names of encoded data slices of the data segment that were not received within a timeframe. The determination may be based on one or more of received slice names, a source name of the data segment, a data segment identifier, a determination of a list of all the slice names of the data segment, and a comparison of the received slice names to the list of all of the slice names of the data segment. The method continues at steps 240-242 of FIG. 18 where the processing module re-determines candidate routing paths, re-determines candidate routing paths such that the resulting re-selected routing paths do not include any failed paths as indicated by the data segment decode failure message, and re-selects routing paths from candidate routing paths.

The method continues at step 250 where the processing module assigns the missing encoded data slices to the re-selected routing paths. For example, the processing module assigns re-selected routing paths to missing encoded data slices that represent information bytes to enable more rapid decoding of the data segment by the receiving DS processing unit. The method continues at step 252 where the processing module re-sends the missing encoded data slices via the associated re-selected routing paths.

FIG. 20A is a flowchart illustrating another example of sending data as slices, which includes similar steps to FIGS. 7, 9, and 16A. The method begins with step 110 of FIG. 7 where a processing module (e.g., of a sending dispersed storage (DS) processing unit) obtains data for transmission. The method continues with steps 136-140 of FIG. 9 where the processing module obtains routing path quality of service information, determines candidate routing paths, selects routing paths from the candidate routing paths, and assigns slices to the selected routing paths. Such an assignment may be based on one or more of the a communications performance requirement, a routing path performance estimate, routing path performance history, the routing path quality of service information, the candidate routing paths, and the selected routing paths. In an example, the processing module assigns slices of pillars 1-5 to routing path 1, pillars 6-10 to routing path 2, pillars 11-13 to routing path 3a, and pillars 14-16 to routing path 4c when a pillar width is 16, a threshold is 10, routing paths 1 and 2 are faster than routing paths 3a and 4c, and routing paths 3a and 4c are more reliable than routing paths 1 and 2. The processing module may assign different sets of pillars on a data segment by data segment basis.

The method continues with step 212 of FIG. 16A where the processing module creates dispersal information. The method continues at step 254 where the processing module combines the dispersal information and the data to produce a data package. For example, the processing module appends the dispersal information to the data to produce the data package. The method continues at step 256 where the processing module dispersed storage error encodes the data package utilizing an error coding dispersal storage function to produce a set of encoded data slices. As such, each slice contains the dispersal information (e.g., appended, interleaved, inserted, etc.). The method continues with step 142 of FIG. 9 where the processing module sends the set of encoded data slices via the routing paths.

FIG. 20B is a flowchart illustrating another example of re-routing data, which includes similar steps to FIG. 16B. The method begins with step 258 where a processing module (e.g., of a relay unit) receives an encoded data slice. The method continues at step 260 where the processing module inspects the encoded data slice to produce dispersal information. Alternatively, the processing module inspects a plurality of encoded data slices of to produce the dispersal information. The method continues with step 218 of FIG. 16B where the processing module determines whether to alter a routing path. The method branches to step 264 when the processing module determines to alter the routing path. The method continues to step 262 when the processing module determines not to alter the routing path. The method continues at step 262 where the processing module forwards the encoded data slices (e.g. including the dispersal information) via an original routing path when the processing module determines not to alter the routing path.

The method continues at step 264 where the processing module obtains routing path quality of service information and determines candidate routing paths when the processing module determines to alter routing paths. The method continues with step 222 of FIG. 16B where the processing module selects a routing path from the candidate routing paths to produce an altered routing path. The method continues at step 266 where the processing module modifies the dispersal information and inserts the modified dispersal information in a modified encoded data slice. For example, the processing module modifies the dispersal information to include the altered path. The method continues at step 268 where the processing module assigns the modified encoded data slice to the altered routing path. The method continues at step 270 where the processing module sends the modified encoded data slice via the associated altered routing path.

Figure 20C:
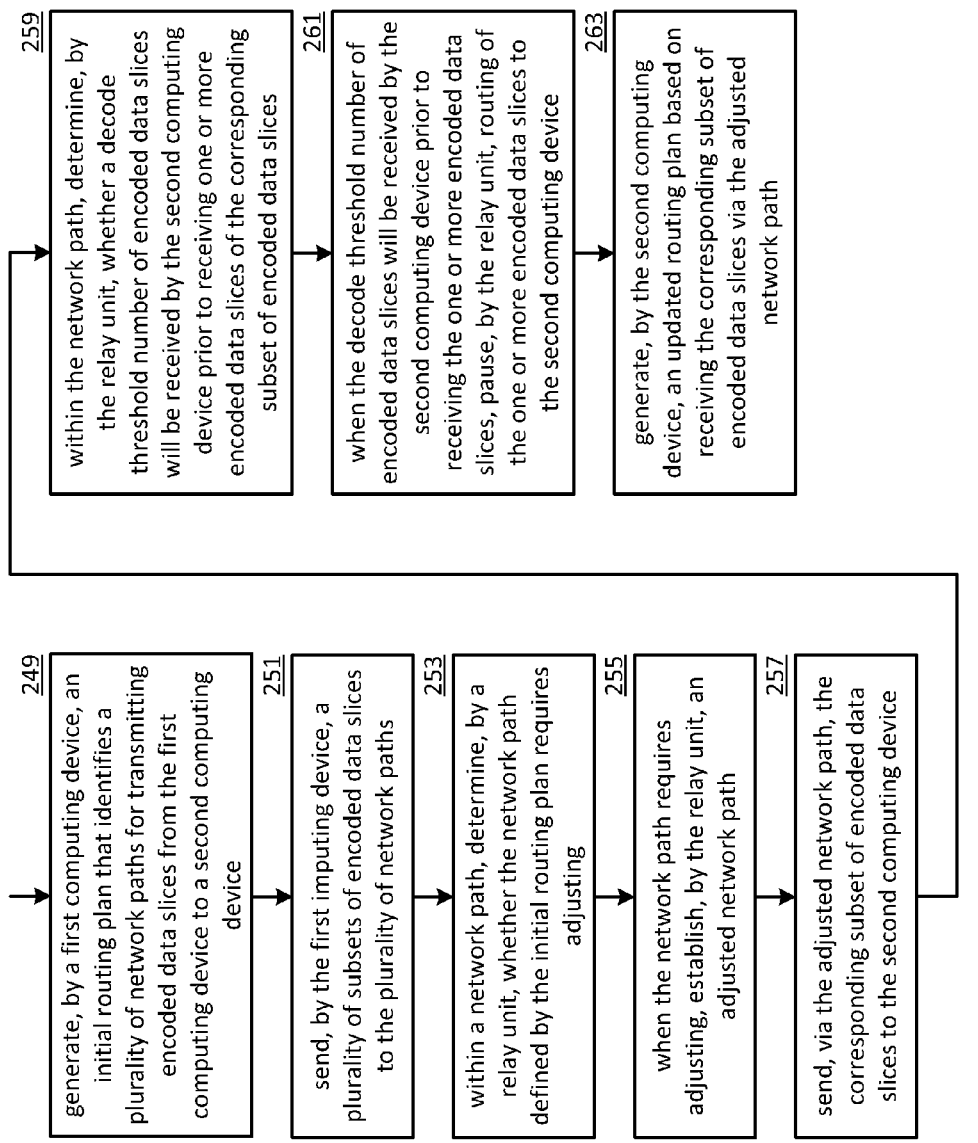
FIG. 20C is a flowchart illustrating an example of adjusting routing of data within a network path in accordance with the present invention.

FIG. 20C is a flowchart illustrating an example of adjusting routing of data within a network path. In particular, a method is presented for use in conjunction with one or more functions and features described in conjunction with FIGS. 1-5, 8A-B, 20A-B, and also FIG. 20C. The method begins at step 249 where a processing module of a first computing device of one or more computing devices of a communications network and/or of a dispersed storage network (DSN) generates an initial routing plan that identifies a plurality of network paths for transmitting encoded data slices of an encoded data segment from the first computing device to a second computing device of the one or more computing devices and/or of the DSN. Each network path of the plurality of network paths includes one or more relay units. A data segment was dispersed storage error encoded to produce the encoded data segment. The encoded data segment includes a set of encoded data slices, where a decode threshold number of encoded data slices of the set of encoded data slices is needed to recover the data segment by the second computing device.

The method continues at step 251 where the first computing device sends a plurality of subsets of encoded data slices to the plurality of network paths. For example, the first computing device divides the set of encoded data slices into the plurality of subsets of encoded data slices, where a network path of the plurality of network paths is allocated to transmit a subset of encoded data slices of the plurality of subsets of encoded data slices from the first computing device to the second computing device. For instance, the first computing device divides the set of encoded data slices into a first subset of encoded data slices that includes a first encoded data slice and a second encoded data slice, and to a second subset of encoded data slices that includes a third encoded data slice and a fourth encoded data slice, etc.

Within a network path of the plurality of network paths, the method continues at step 253 where a relay unit of the one or more relay units of the network path determines whether the network path defined by the initial routing plan requires adjusting based on characteristics of other network paths of the plurality of network paths and the decode threshold number of encoded data slices being received by the second computing device. As a specific example, the relay unit identifies an estimated performance characteristics of the other network paths (e.g., based on one or more of the initial routing plan, a current routing plan, and performance information from relay units associated with the other network paths) and compares the identified estimated performance characteristics of the other network paths to an estimated performance characteristic of the network path. As another specific example, the relay unit determines that the decode threshold number of encoded data slices will be received by the second computing device prior to receiving one or more encoded data slices of the corresponding subset of encoded data slices (e.g., the estimated performance characteristic of the network path compares unfavorably to the estimated performance characteristics of the other network paths).

When the network path requires adjusting, the method continues at step 255 where the relay unit establishes an adjusted network path. The establishing may include at least one of adding a relay unit (e.g., a higher performing relay unit, a relay unit with more favorable network path connections) to the one or more relay units and deleting a relay unit from the one or more relay units (e.g., bypass the deleted relay unit). The establishing the adjusted network path may further include the relay unit dividing the network path into two or more network paths to produce the adjusted network path (e.g., creating two or more parallel paths).

The method continues at step 257 where the one or more relay units associated with the adjusted network path sends, via the adjusted network path, the corresponding subset of encoded data slices to the second computing device. For example, each relay unit of the one or more relay units interprets the adjusted network path and forwards the received corresponding subset of encoded data slices in accordance with the adjusted network path.

Within the network path of the plurality of network paths, the method continues at step 259 where the relay unit determines whether the decode threshold number of encoded data slices will be received by the second computing device prior to receiving one or more encoded data slices of the corresponding subset of encoded data slices (e.g., receives an indication from the second computing device, estimates encoded data slice arrival times, compares the estimated arrival times). When the decode threshold number of encoded data slices will be received by the second computing device prior to receiving the one or more encoded data slices, the method continues at step 261 where the relay unit pauses routing of the one or more encoded data slices to the second computing device (e.g., temporarily stores the one or more encoded data slices for a temporary storage time period, ceases transmission of the one or more encoded data slices, deletes the one or more encoded data slices).

The method continues at step 263 where a processing module of the second computing unit generates an updated routing plan based on receiving the corresponding subset of encoded data slices via the adjusted network path. For example, the second computing unit generates the updated routing plan for the first subset of encoded data slices when receiving all of the second subset of encoded data slices prior to receiving all of the first subset of encoded data slices.

The method described above in conjunction with the processing module can alternatively be performed by other modules of the dispersed storage network or by other devices. In addition, at least one memory section (e.g., a computer readable storage medium) that stores operational instructions can, when executed by one or more processing modules of one or more computing devices of the communications network and/or dispersed storage network (DSN), cause the one or more computing devices to perform any or all of the method steps described above.

Figure 21A:
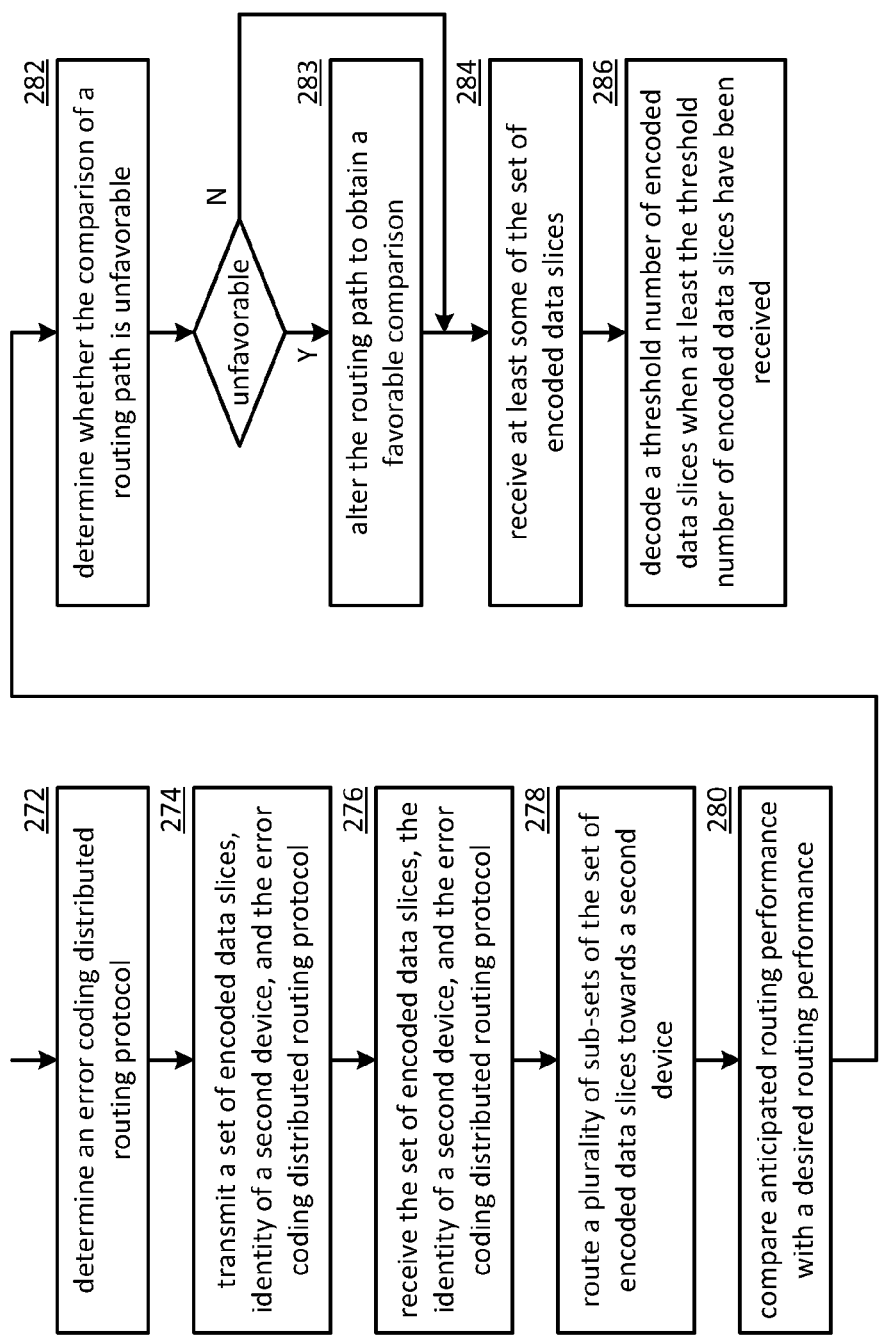
FIG. 21A is a flowchart illustrating another example of re-routing data in accordance with the present invention.

FIG. 21A is a flowchart illustrating another example of re-routing data. The method begins at step 272 where a first device (e.g., a processing module of a sending dispersed storage (DS) processing unit) determines an error coding distributed routing protocol. The error coding distributed routing protocol includes at least one of identity of an initial plurality of routing paths, a number of routing paths, a number of sub-sets of a set of encoded data slices, a desired routing performance for one or more of the sub-sets of the set of encoded data slices, a request for multiple path transmission of the set of encoded data slices, a capacity estimate of the initial plurality of routing paths, a priority indicator for at least one of the sub-sets, a security indicator for at least one of the sub-sets, and a performance indicator for at least one of the sub-sets.

The method continues at step 274 where the first device transmits a set of encoded data slices, identity of a second device, and the error coding distributed routing protocol to at least one of a network and a network node (e.g., of the network) wherein the set of encoded data slices represents data that has been dispersed storage error encoded. The method continues at step 276 where at least one of the network and the network node receive, from the first device, the set of encoded data slices, the identity of the second device, and the error coding distributed routing protocol. Alternatively, the at least one of the network and the network node obtains the error coding distributed routing protocol by one of utilizing an error coding distributed routing protocol from a previous message, performing a lookup, and utilizing a predetermined error coding distributed routing protocol.

The method continues at step 278 where the network routes a plurality of sub-sets of the set of encoded data slices via an initial plurality of routing paths towards the second device in accordance with the error coding distributed routing protocol. Alternatively, the network node routes the plurality of sub-sets of the set of encoded data slices via the initial plurality of routing paths from the first device towards the second device in accordance with the error coding distributed routing protocol when the network node is utilized.

The method continues at step 280 where at least one of the network and the network node compares anticipated routing performance of the routing of the plurality of sub-sets with a desired routing performance (e.g., the desired routing performance included as part of the error coding distributed routing protocol). The comparing includes for a link of a plurality of links of the routing path, determining the anticipated routing performance of the link, comparing the anticipated routing performance of the link with a corresponding portion of the desired routing performance, and when the comparison of the anticipated routing performance of the link with the corresponding portion of the desired routing performance is unfavorable, indicating that the comparison of the anticipated routing performance of the routing of the plurality of sub-sets with the desired routing performance is unfavorable.

The method continues at step 282 where at least one of the network and the network node determine whether the comparison of a routing path of the initial plurality of routing paths is unfavorable. For example, the comparison is determined as unfavorable when an absolute value of a difference between the anticipated routing performance and the desired routing performance is greater than a performance threshold. The method branches to step 284 when one of the network and the network node determine that the comparison of the routing path of the initial plurality of routing paths is favorable. The method continues to step 283 when one of the network and the network node determine that the comparison of the routing path of the initial plurality of routing paths is unfavorable.

The method continues at step 283 where at least one of the network and the network node alters the routing path to obtain a favorable comparison. The altering the routing path includes dispersed storage error encoding an encoded data slice of a corresponding sub-set of the plurality of sub-sets to produce a set of encoded data sub-slices, determining a plurality of sub-routing paths, and routing the set of encoded data sub-slices to the second device via the plurality of sub-routing paths. The altering the routing path further includes at least one of selecting a lower latency routing path, selecting a higher data rate routing path, selecting a routing path with higher capacity, selecting a routing path with a lower error rate, selecting a routing path with a higher cost, selecting a higher latency routing path, selecting a lower data rate routing path, selecting a routing path with a higher error rate, selecting a routing path with a lower cost, and selecting a routing path with lower capacity.

The method continues at step 284 where the second device receives at least some of the set of encoded data slices from the network. The method continues at step 286 where the second device decodes at least a threshold number (e.g., a decode threshold number) of encoded data slices to reproduce the data when the at least a threshold number of encoded data slices have been received.

Figure 21B:
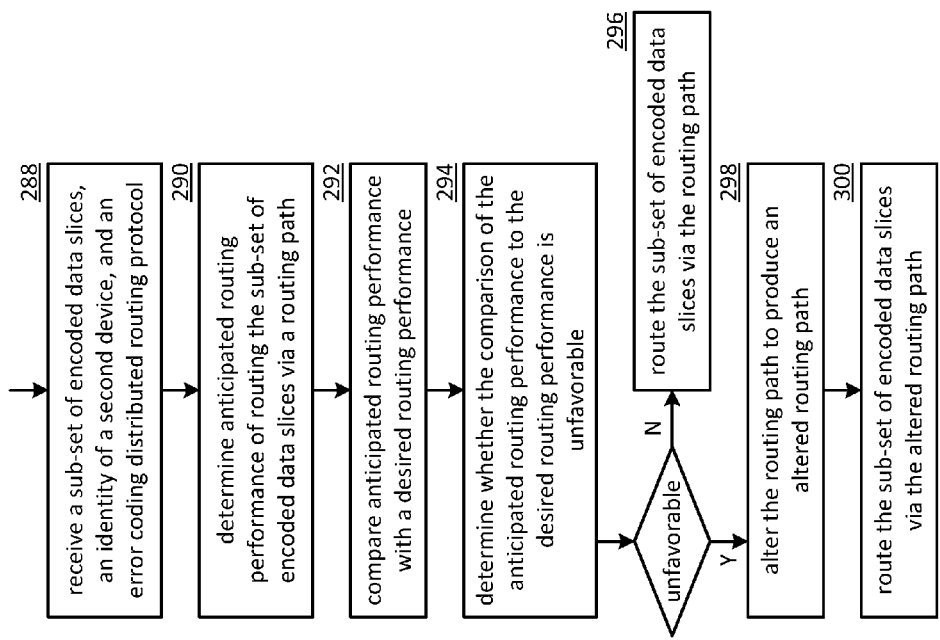
FIG. 21B is a flowchart illustrating another example of re-routing data in accordance with the present invention.

FIG. 21B is a flowchart illustrating another example of re-routing data. The method begins at step 288 where a processing module (e.g. of a relay unit, of a network node) receives a sub-set of encoded data slices, an identity of a second device, and an error coding distributed routing protocol, wherein a set of encoded data slices represents data that has been dispersed storage error encoded and includes the sub-set of encoded data slices. The method continues at step 290 where the processing module determines anticipated routing performance of routing the sub-set of encoded data slices via a routing path to the second device in accordance with the error coding distributed routing protocol. The method continues at step 292 where the processing module compares the anticipated routing performance with a desired routing performance. The comparing the anticipated routing performance includes for a link of a plurality of links of the routing path, determining anticipated routing performance of the link, comparing the anticipated routing performance of the link with a corresponding portion of the desired routing performance, and when the comparison of the anticipated routing performance of the link with the corresponding portion of the desired routing performance is unfavorable, indicating that the comparison of the anticipated routing performance of the routing of the plurality of sub-sets with the desired routing performance is unfavorable.

The method continues at step 294 where the processing module determines whether the comparison of the anticipated routing performance to the desired routing performance is unfavorable. The method branches to step 298 when the processing module determines that the comparison of the anticipated routing performance to the desired routing performance is unfavorable. The method continues to step 296 when the processing module determines that the comparison of the anticipated routing performance to the desired routing performance is favorable. The method continues to step 296 where the processing module routes the sub-set of encoded data slices via the routing path.

The method continues at step 298 where the processing module alters the routing path to obtain a favorable comparison to produce an altered routing path. The altering the routing path includes dispersed storage error encoding an encoded data slice of the sub-set of encoded data slices to produce a set of encoded data sub-slices, determining a plurality of sub-routing paths, and routing the set of encoded data sub-slices to the second device via the plurality of sub-routing paths. The altering the routing path may further include at least one of selecting a lower latency routing path, selecting a higher data rate routing path, selecting a routing path with higher capacity, selecting a routing path with a lower error rate, selecting a routing path with a higher cost, selecting a higher latency routing path, selecting a lower data rate routing path, selecting a routing path with a higher error rate, selecting a routing path with a lower cost, and selecting a routing path with lower capacity. The method continues at step 300 where the processing module routes the sub-set of encoded data slices to the second device via the altered routing path.

Figure 22:
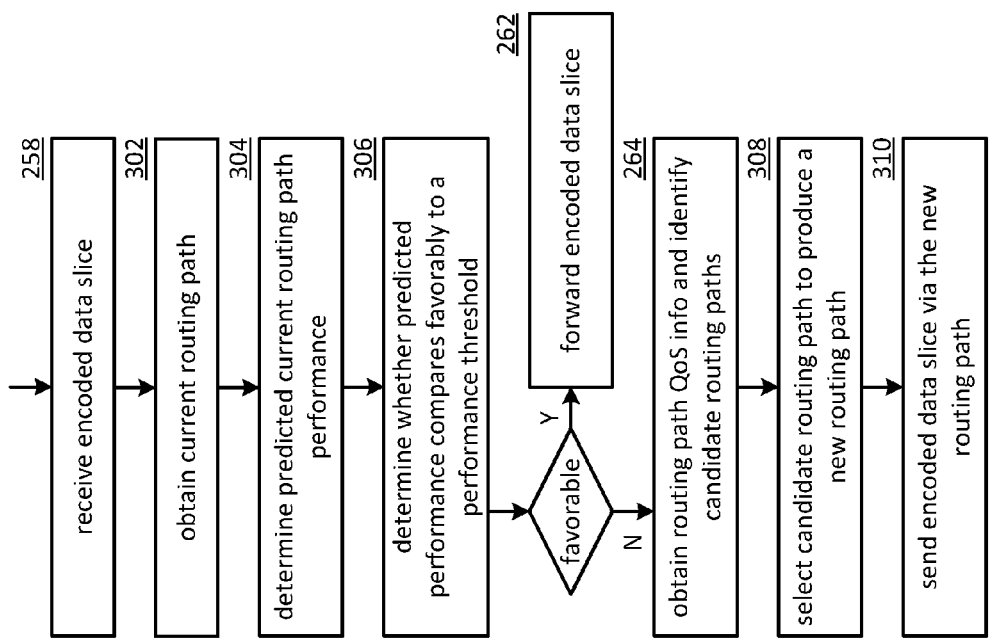
FIG. 22 is a flowchart illustrating another example of re-routing data in accordance with the present invention.
Figure 23:
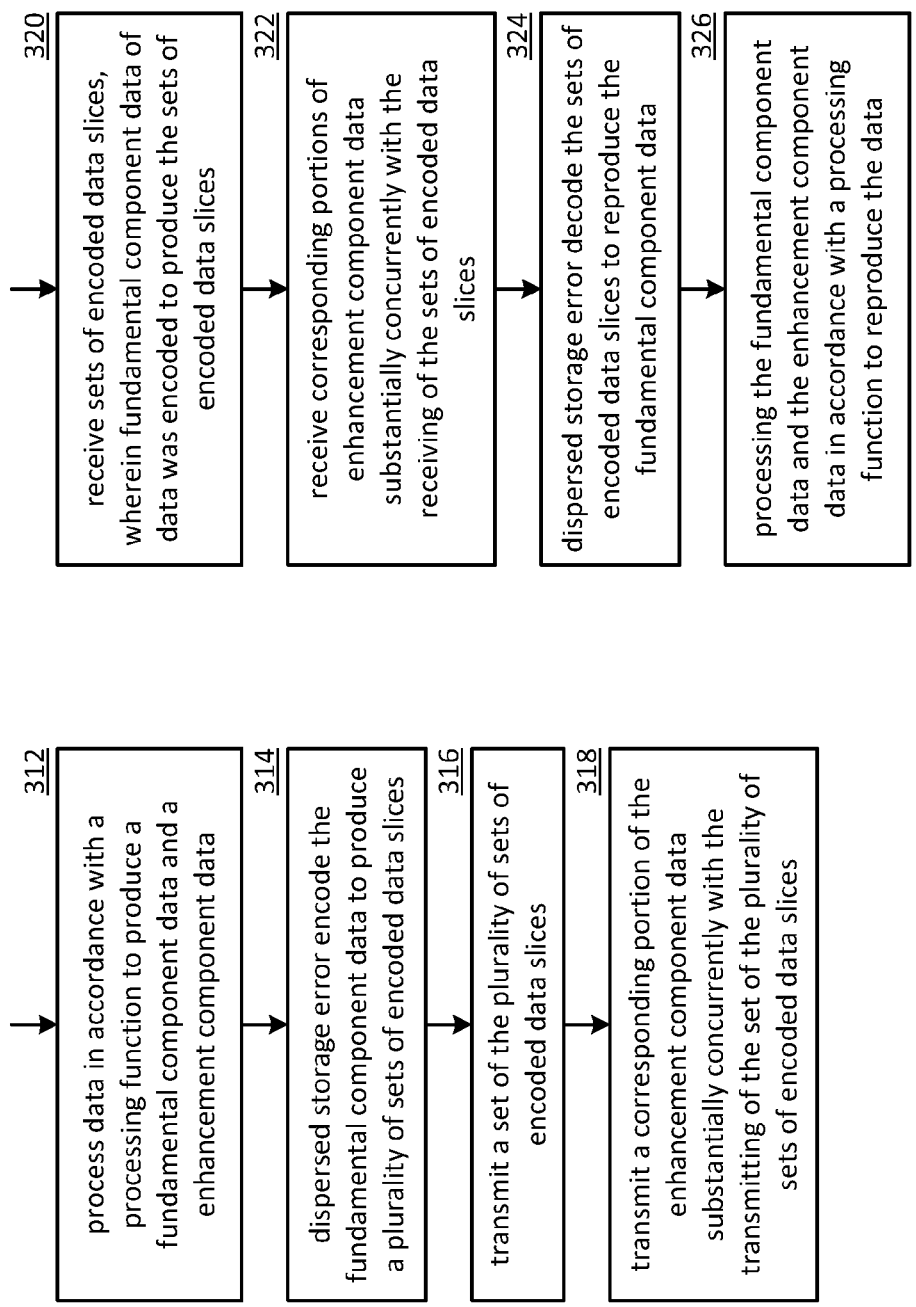
FIG. 23A is a flowchart illustrating another example of sending data as slices in accordance with the present invention.
FIG. 23B is a flowchart illustrating another example of receiving data in accordance with the present invention.

FIG. 22 is a flowchart illustrating another example of re-routing data, which include similar steps to FIG. 20B. The method begins with step 258 of FIG. 20B where a processing module (e.g., of a relay unit) receives an encoded data slice. The method continues at step 302 where the processing module obtains a current routing path, wherein the current routing path is associated with a routing path of the encoded data slice as it is routed to a receiving entity (e.g., a receiving dispersed storage (DS) processing unit). The obtaining may be based on one or more of the encoded data slice, dispersal information associated with the encoded data slice, embedded information with the current data slice, a list, a lookup, a previously received encoded data slice, and a message. The method continues at step 304 where the processing module determines predicted current routing path performance. The determination may be based on one or more of the current routing path, historical performance information, a query, a list, a lookup, and a message.

The method continues at step 306 where the processing module determines whether the predicted current routing path performance compares favorably to a performance threshold. The determination may be based on one or more of obtaining the performance threshold from a list, obtaining the performance threshold from a message, determining the performance threshold based on historical performance information (e.g., a running average), and comparing the predicted current routing path performance to the performance threshold. For example, the processing module determines that the predicted current routing path performance compares favorably to a performance threshold when the predicted current routing path performance is superior to the performance threshold. The method branches to step 264 FIG. 20B when the processing module determines that the predicted current routing path performance does not compare favorably to the performance threshold. The method continues to step 262 of FIG. 20B when the processing module determines that the predicted current routing path performance compares favorably to the performance threshold. The method continues with step 262 of FIG. 20B where the processing module forwards the encoded data slice via the current routing path.

The method continues with step 264 FIG. 20B where the processing module obtains routing path quality of service information and identifies candidate routing paths when the processing module determines that the predicted current routing path performance does not compare favorably to the performance threshold. The processing module considers currently available paths from the perspective of the processing module (e.g., the relay unit). The method continues at step 308 where the processing module selects a candidate routing path to produce a new routing path to optimize performance of sending the encoded data slice to the receiving entity. The processing module may choose a different routing path to overcome a reliability issue between the processing module and the receiving entity. The selection to produce the new routing path may be based on one or more of optimizing quality of service performance, a size of the encoded data slice, the candidate routing paths, and estimated performance of each of the candidate routing paths. The method continues at step 300 and where the processing module sends the encoded data slice via the new routing path. The sending may include sending the new routing path to one or more relay units associated with the new routing path.

FIG. 23A is a flowchart illustrating another example of sending data as slices. The method begins at step 312 where a processing module (e.g. a sending dispersed storage (DS) processing unit) processes data in accordance with a processing function to produce a fundamental component data and an enhancement component data. The data may include any type of analog or digital representation of data content, media content, data streams, video, audio, speech, word processing files, financial records, software, etc. The processing function includes one or more of a data component priority segregation function, a spectral analysis function (e.g., a first band of spectrum corresponding to the fundamental component data and a second band of spectrum corresponding to the enhancement component data), and a data filter function (e.g., separating video frames, standard definition video as the fundamental component data, high-definition video as the enhancement component data, a graphic overlay as the enhancement component data, and audio stream as the enhancement component data).

For example, the processing module processes a word processing application produced document file utilizing a document file data component priority segregation function to produce text as the fundamental component data and one or more of features, parameters, and preferences of the document file as the enhancement component data. As another example, the processing module processes a word processing application software download file utilizing a software download file data component priority segregation function to produce core software as the fundamental component data and one or more of features, language settings, font information, and preferences of the software download file as the enhancement component data. As yet another example, the enhancement component data includes a first level of enhancement component data and a second level of enhancement component data. As a further example, the processing module processes the data in accordance with a video processing function to produce the fundamental component data and the enhancement component data when the data includes video data (e.g., a video stream, a video file, a multimedia stream, a multimedia file).

The method continues at step 314 where the processing module dispersed storage error encodes the fundamental component data of data in accordance with dispersed storage error coding parameters to produce a plurality of sets of encoded data slices, wherein the data includes the fundamental component data and the enhancement component data. The processing module may determine the dispersed storage error coding parameters based on at least one of metadata (e.g., addressing information, data type information, data size information, etc.) associated with the data and metadata associated with the fundamental component data. For example, the processing module determines the dispersed storage error coding parameters to include a pillar width of 32 and a decode threshold of 10 to provide improved reliability when metadata associated with the data indicates that the data includes a video surveillance video stream.

In an example of dispersed storage error encoding, the processing module dispersed storage error encodes a first fundamental component data in accordance with first dispersed storage error coding parameters to produce a first plurality of sets of encoded data slices and dispersed storage error encodes a second fundamental component data in accordance with second dispersed storage error coding parameters to produce a second plurality of sets of encoded data slices when the fundamental component data includes the first level of fundamental component data and the second level of fundamental component data, the dispersed storage error coding parameters includes the first dispersed storage error coding parameters and the second dispersed storage error coding parameters, and the plurality of sets of encoded data slices includes the first plurality of sets of encoded data slices and the second plurality of sets of encoded data slices.

The method continues at step 316 where the processing module transmits a set of the plurality of sets of encoded data slices to a receiving entity (e.g., to a receiving DS processing unit via a network). The method continues at step 318 where the processing module transmits a corresponding portion of the enhancement component data substantially concurrently with the transmitting of the set of the plurality of sets of encoded data slices. For example, the processing module transmits the corresponding portion of the enhancement component data such that the corresponding portion of the enhancement component data and the corresponding set of the plurality of sets of encoded data slices arrive substantially concurrently at the receiving entity. As another example, the processing module transmits the corresponding portion of the enhancement component data such that the corresponding portion of the enhancement component data and the corresponding set of the plurality of sets of encoded data slices are substantially transmitted concurrently. The transmitting the corresponding portion of the enhanced component data may include dispersed storage error encoding the enhancement component data in accordance with a second dispersed storage error coding parameters to produce a second plurality of sets of encoded data slices, and transmitting, as the corresponding portion of the enhancement component data, a set of the second set of encoded data slices.

FIG. 23B is a flowchart illustrating another example of receiving data. The method begins at step 320 where a processing module (e.g., a receiving dispersed storage (DS) processing unit) receives sets of encoded data slices, wherein fundamental component data of data was encoded in accordance with dispersed storage error coding parameters to produce the sets of encoded data slices, wherein the data includes the fundamental component data and enhancement component data. The method continues at step 322 where the processing module receives corresponding portions of the enhancement component data substantially concurrently with the receiving of the sets of encoded data slices. The receiving the corresponding portions of the enhancement component data may include receiving a second plurality of sets of encoded data slices and dispersed storage error decoding the enhancement component data in accordance with dispersed storage error coding parameters to reproduce the enhancement component data.

The method continues at step 324 where the processing module dispersed storage error decodes the sets of encoded data slices to reproduce the fundamental component data. For example, the processing module dispersed storage error decodes a first plurality of sets of encoded data slices in accordance with first dispersed storage error coding parameters to reproduce a first level of fundamental component data and the processing module dispersed storage error decodes a second plurality of sets of encoded data slices in accordance with second dispersed storage error coding parameters to reproduce a second level of fundamental component data when the fundamental component data includes first level of fundamental component data and second level of fundamental component data and the sets of encoded data slices includes the first plurality of sets of encoded data slices and the second plurality of sets of encoded data slices.

The method continues at step 326 where the processing module processes the fundamental component data and the enhancement component data in accordance with a processing function to reproduce the data. For example, the processing module processes the fundamental component data and the enhancement component data in accordance with a video processing function to reproduce video data when the data includes video data.

Figure 24:
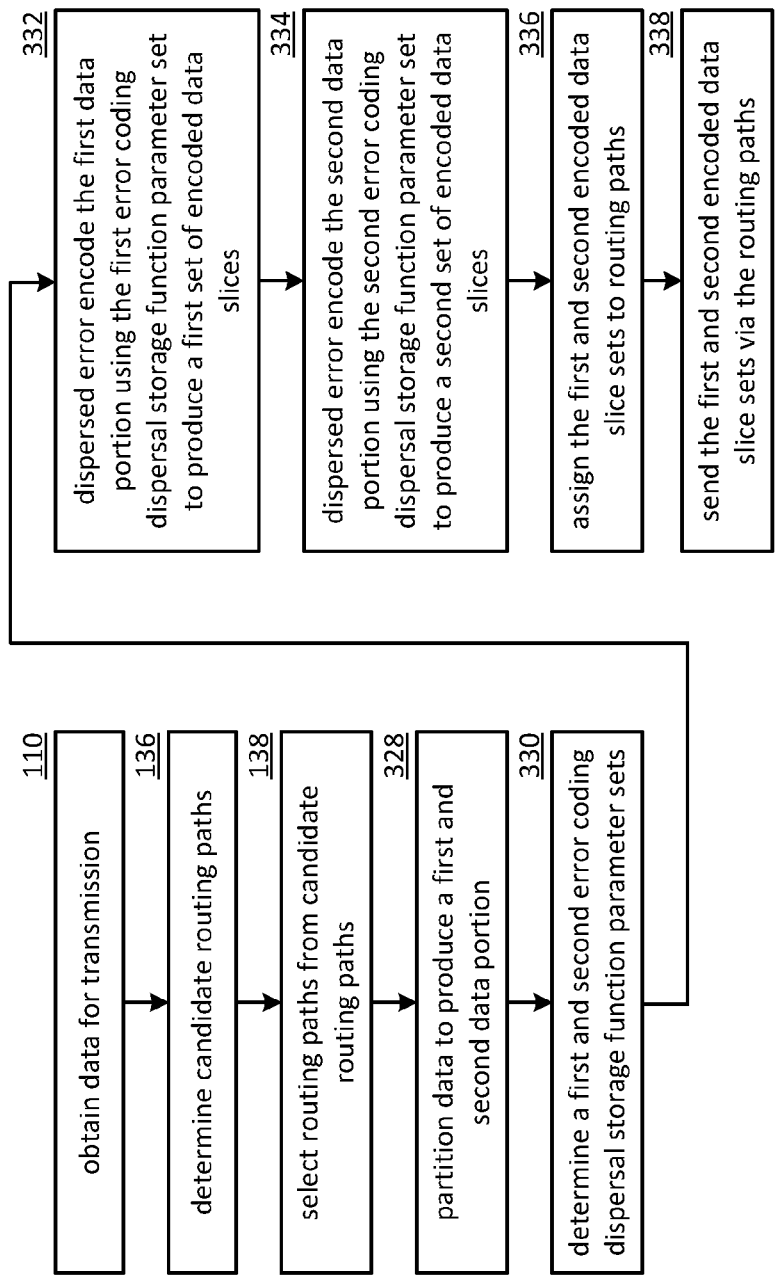
FIG. 24 is a flowchart illustrating another example of sending data as slices in accordance with the present invention.

FIG. 24 is a flowchart illustrating another example of sending data as slices, that includes similar steps to FIGS. 7 and 9. The method begins with step 110 from FIG. 7 where a processing module (e.g., of a sending dispersed storage (DS) processing unit) obtains data for transmission. The method continues with steps 136-138 of FIG. 9 where the processing module obtains routing path quality of service information, determines candidate routing paths, and selects routing paths from the candidate routing paths. The method continues at step 328 where the processing module partitions the data to produce a first data portion and a second data portion. The processing module may partition the data into any number of data portions. The portions may include one or more of addressing information, header information, base video frame information, difference video frame information, digital media content, parity information, validation information, a data type indicator, etc. The partitioning may be based on one or more of a data type indicator, a data analysis, a data size indicator, a priority indicator, a security indicator, buffer bits, authentication indicator, performance indicator, a lookup, a message, and a predetermination.

For the example, the processing module partitions the data to produce a first data portion that includes high priority information based on a priority indicator. For instance, the processing module partitions the data to produce the first data portion that includes a video header, addressing information, parity information, and a plurality of base video frames information when the priority indicator indicates that high priority video information is to be partitioned into the first data portion. As another instance, the processing module partitions the data to produce the second data portion that includes a plurality of difference video frames information and a plurality of buffer bits when the priority indicator indicates that lower priority video information is to be partitioned into the second data portion. In such instances, it may be more important to communicate the first data portion than the second data portion.

The method continues at step 330 where the processing module determines first and second error coding dispersal storage function parameter sets that correspond to the first and second data portions. The determination may be based on one or more of the routing path quality of service information, the candidate routing paths, the selected routing paths, the first and second data portions, a communications requirement, a data type indicator, a capacity estimate of the selected routing paths, a priority indicator, a security indicator, a performance indicator, an estimated routing path performance indicator, a lookup, and a message. For example, the processing module determines the first error coding dispersal storage function parameters to include a pillar width and a threshold to favor reliability for transmission of the first data portion when the first data portion represents high priority video information. For instance, the processing module selects a pillar width of 15 and a threshold of 8 when the communications requirement of the first data portion includes a high-reliability requirement. As another example, the processing module determines the second error coding dispersal storage function parameters to include a pillar width and a threshold to favor efficiency over reliability for transmission of the second data portion when the second data portion represents lower priority video information. For instance, the processing module selects a pillar width of 10 and a threshold of 8 when the communications requirement of the second data portion includes a high-efficiency requirement.

The method continues at step 332 where the processing module dispersed storage error encodes the first data portion utilizing an error coding dispersal storage function in accordance with the first error coding dispersal storage function parameter set to produce a first set of encoded data slices. The method continues at step 334 where the processing module dispersed storage error encodes the second data portion utilizing the error coding dispersal storage function in accordance with the second error coding dispersal storage function parameter set to produce a second set of encoded data slices.

The method continues at step 336 where the processing module assigns the first and second encoded data slice sets to the selected routing paths. The assigning may be based on one or more of the first and second encoded data slice sets, the routing path quality of service information, the candidate routing paths, the selected routing paths, routing requirements, historical routing path performance, estimated routing path performance, a message, a lookup, a predetermination, and a command. For example, the processing module assigns the first set of encoded data slices to routing paths associated with lower reliability when the first error coding dispersal storage function parameter set is associated with high reliability. As another example, the processing module assigns the second set of encoded data slices to routing paths associated with higher reliability when the second error coding dispersal storage function parameter set is associated with high efficiency and low reliability. The method continues at step 338 where the processing module sends the first and second encoded data slice sets via the routing paths.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may have an associated memory and/or an integrated memory element, which may be a single memory device, a plurality of memory devices, and/or embedded circuitry of the processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a functional block that is implemented via hardware to perform one or module functions such as the processing of one or more input signals to produce one or more output signals. The hardware that implements the module may itself operate in conjunction software, and/or firmware. As used herein, a module may contain one or more sub-modules that themselves are modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method comprises:
   determining, by a first computing device, a routing plan to route a set of encoded data slices from the first computing device to a second computing device via a plurality of network paths within a communications network, wherein a data segment was dispersed storage error encoded to produce the set of encoded data slices, wherein a decode threshold number of encoded data slices of the set of encoded data slices is needed to recover the data segment, wherein the first and second computing devices are operably coupled to the communications network, and wherein each network path of the plurality of network paths includes one or more relay units;
   receiving, by the second computing device, encoded data slices of the set of encoded data slices via one or more network paths of the plurality of network paths;
   when the second computing device receives the decode threshold number of encoded data slices, sending, by the second computing device, a message to the communications network; and
   when the message indicates receipt of the decode threshold number of encoded data slices:
      determining, by a relay unit of the one or more relay units of a corresponding network path of the plurality of network paths, whether the relay unit is in possession of a not-yet delivered encoded data slice of the set of encoded data slices; and
      when the relay unit is in possession of the not-yet delivered encoded data slice, ceasing, by the relay unit, forwarding of the not-yet delivered encoded data slice along the corresponding network path.

2. The method of claim 1 further comprises:
   determining, by the relay unit, that the relay unit is not in possession of the not-yet delivered encoded data slice;
   determining, by the relay unit, whether the corresponding network path is assigned to the not-yet delivered encoded data slice; and
   when the corresponding network path is assigned to the not-yet delivered encoded data slice, forwarding, by the relay unit, the message upstream along the corresponding network path.

3. The method of claim 1 further comprises:
   when the message indicates receipt of the decode threshold number of encoded data slices and the message is indicative of a pause message, the ceasing, by the relay unit, forwarding of the not-yet delivered encoded data slice along the corresponding network path includes temporarily storing the not-yet delivered encoded data slice; and
   continuing, by the relay unit, to temporarily store the not-yet delivered encoded data slice until a further processing event occurs.

4. The method of claim 3, wherein the further processing event comprises one or more:
   deleting the not-yet delivered encoded data slice after expiration of a pause time period;
   receiving a second message indicating deletion of the not-yet delivered encoded data slice; and
   receiving a third message indicating forwarding of the not-yet delivered encoded data slice downstream along the corresponding network path.

5. The method of claim 1 further comprises:
   interpreting, by the relay unit, that the message indicates receipt of the decode threshold number of encoded data slices and the message is a delete command regarding the not-yet delivered encoded data slice; and
   ceasing, by the relay unit, the forwarding of the not-yet delivered encoded data slice by deleting the not-yet delivered encoded data slice.

6. The method of claim 1 further comprises:
   decoding, by the second computing device, the decode threshold number of encoded data slices to produce a decoded data segment; and
   when the decoded data segment is validated, sending a second message indicating deletion of the not-yet delivered encoded data slice and other not-yet delivered encoded data slices.

7. The method of claim 1 further comprises:
   decoding, by the second computing device, the decode threshold number of encoded data slices to produce a decoded data segment; and
   when the decoded data segment is not validated, sending a second message indicating a request for delivery of the not-yet delivered encoded data slice.

8. The method of claim 1 further comprises:
   determining, by the relay unit, whether delivery of a sub-set of encoded data slices of the set of encoded data slices allocated for delivery via the corresponding network path have been delivered to the second computing device; and
   when delivery of the sub-set of encoded data slices of the set of encoded data slices allocated for delivery via the corresponding network path have been delivered to the second computing device, ignoring, by the relay unit, the message.

9. A non-transitory computer readable storage medium comprises:
   at least one memory section that stores operational instructions that, when executed by one or more processing modules of one or more computing devices, causes the one or more computing devices to:
      determine, by a first computing device of the one or more computing devices, a routing plan to route a set of encoded data slices from the first computing device to a second computing device of the one or more computing devices via a plurality of network paths within a communications network, wherein a data segment was dispersed storage error encoded to produce the set of encoded data slices, wherein a decode threshold number of encoded data slices of the set of encoded data slices is needed to recover the data segment, wherein the first and second computing devices are operably coupled to the communications network, and wherein each network path of the plurality of network paths includes one or more relay units of the one or more computing devices;
      receive, by the second computing device, encoded data slices of the set of encoded data slices via one or more network paths of the plurality of network paths;
      when the second computing device receives the decode threshold number of encoded data slices, send, by the second computing device, a message to the communications network; and
      when the message indicates receipt of the decode threshold number of encoded data slices:

determine, by a relay unit of the one or more relay units of a corresponding network path of the plurality of network paths, whether the relay unit is in possession of a not-yet delivered encoded data slice of the set of encoded data slices; and when the relay unit is in possession of the not-yet delivered encoded data slice, cease, by the relay unit, forwarding of the not-yet delivered encoded data slice along the corresponding network path.

10. The non-transitory computer readable storage medium of claim 9 further comprises:

the at least one memory section stores further operational instructions that, when executed by the one or more processing modules, causes the one or more computing devices to:

determine, by the relay unit, that the relay unit is not in possession of the not-yet delivered encoded data slice;

determine, by the relay unit, whether the corresponding network path is assigned to the not-yet delivered encoded data slice; and when the corresponding network path is assigned to the not-yet delivered encoded data slice, forward, by the relay unit, the message upstream along the corresponding network path.

11. The non-transitory computer readable storage medium of claim 9 further comprises:

the at least one memory section stores further operational instructions that, when executed by the one or more processing modules, causes the one or more computing devices to:

when the message indicates receipt of the decode threshold number of encoded data slices and the message is indicative of a pause message, cease, by the relay unit, forwarding of the not-yet delivered encoded data slice along the corresponding network path by temporarily storing the not-yet delivered encoded data slice; and continue, by the relay unit, to temporarily store the not-yet delivered encoded data slice until a further processing event occurs.

12. The non-transitory computer readable storage medium of claim 11, wherein the further processing event comprises the one or more processing modules functioning to execute the operational instructions stored by the at least one memory section causing the one or more computing devices to:

delete the not-yet delivered encoded data slice after expiration of a pause time period; or receive a second message indicating deletion of the not-yet delivered encoded data slice; or receive a third message indicating forwarding of the not-yet delivered encoded data slice downstream along the corresponding network path.

13. The non-transitory computer readable storage medium of claim 9 further comprises:

the at least one memory section stores further operational instructions that, when executed by the one or more processing modules, causes the one or more computing devices to:

interpret, by the relay unit, that the message indicates receipt of the decode threshold number of encoded data slices and the message is to be a delete command regarding the not-yet delivered encoded data slice; and cease, by the relay unit, the forwarding of the not-yet delivered encoded data slice by deleting the not-yet delivered encoded data slice.

14. The non-transitory computer readable storage medium of claim 9 further comprises:

the at least one memory section stores further operational instructions that, when executed by the one or more processing modules, causes the one or more computing devices to:

decode, by the second computing device, the decode threshold number of encoded data slices to produce a decoded data segment; and when the decoded data segment is validated, send a second message indicating deletion of the not-yet delivered encoded data slice and other not-yet delivered encoded data slices.

15. The non-transitory computer readable storage medium of claim 9 further comprises:

the at least one memory section stores further operational instructions that, when executed by the one or more processing modules, causes the one or more computing devices to:

decode, by the second computing device, the decode threshold number of encoded data slices to produce a decoded data segment; and when the decoded data segment is not validated, send a second message indicating a request for delivery of the not-yet delivered encoded data slice.

16. The non-transitory computer readable storage medium of claim 9 further comprises:

the at least one memory section stores further operational instructions that, when executed by the one or more processing modules, causes the one or more computing devices to:

determine, by the relay unit, whether delivery of a sub-set of encoded data slices of the set of encoded data slices allocated for delivery via the corresponding network path have been delivered to the second computing device; and when delivery of the sub-set of encoded data slices of the set of encoded data slices allocated for delivery via the corresponding network path have been delivered to the second computing device, ignore, by the relay unit, the message.

* * * * *